(12) United States Patent
Park

(10) Patent No.: US 11,437,444 B2
(45) Date of Patent: Sep. 6, 2022

(54) DISPLAY DEVICE

(71) Applicant: Samsung Display Co., Ltd., Yongin-si (KR)

(72) Inventor: Myoung Seo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 17/129,570

(22) Filed: Dec. 21, 2020

(65) Prior Publication Data

US 2021/0151514 A1 May 20, 2021

Related U.S. Application Data

(63) Continuation of application No. 16/515,688, filed on Jul. 18, 2019, now Pat. No. 10,916,601, which is a (Continued)

(30) Foreign Application Priority Data

Mar. 20, 2017 (KR) .................. 10-2017-0034710

(51) Int. Cl.
*H01L 27/32* (2006.01)
*H01L 51/52* (2006.01)
(Continued)

(52) U.S. Cl.
CPC ............ *H01L 27/323* (2013.01); *G06F 3/044* (2013.01); *G06F 3/0412* (2013.01); (Continued)

(58) Field of Classification Search
None
See application file for complete search history.

(56) References Cited

U.S. PATENT DOCUMENTS 9,007,340 B2 4/2015 Lee
9,224,981 B2 * 12/2015 Kang .................. H01L 51/5256
(Continued)

FOREIGN PATENT DOCUMENTS

CN 105957874 9/2016
CN 106384742 2/2017
(Continued)

OTHER PUBLICATIONS

Chinese Office Action dated Nov. 12, 2021, issued for CN 201810204330.0 (with English Concise Explanation).
(Continued)

*Primary Examiner* — Vinh T Lam
(74) *Attorney, Agent, or Firm* — H.C. Park & Associates, PLC

(57) ABSTRACT

An electroluminescent device includes a lower structure including an emission area and a peripheral area, a flexible encapsulating multilayer, and a touch panel including a touch electrode. The emission area includes an electroluminescent unit including a lower electrode disposed on an insulating film, an intermediate film, and an upper electrode disposed on the intermediate film. The peripheral area includes an inorganic surface portion substantially surrounding the emission area, various terminals, and wires. A lower surface of the flexible encapsulating multilayer and an upper surface of the inorganic surface portion each include only one or more inorganic materials in direct contact with each other.

30 Claims, 12 Drawing Sheets

Related U.S. Application Data continuation of application No. 15/847,879, filed on Dec. 19, 2017, now Pat. No. 10,403,692.

(51) Int. Cl.
  *G06F 3/041* (2006.01)
  *G06F 3/044* (2006.01)

(52) U.S. Cl.
  CPC ...... *H01L 27/3276* (2013.01); *H01L 51/5253* (2013.01); *G06F 3/0446* (2019.05); *G06F 2203/04102* (2013.01); *G06F 2203/04103* (2013.01); *G06F 2203/04111* (2013.01); *H01L 27/3279* (2013.01)

(56) References Cited

U.S. PATENT DOCUMENTS

| | | | |
|---|---|---|---|
| 9,306,187 B2 | 4/2016 | Lee et al. | |
| 9,368,760 B2* | 6/2016 | Cho | H01L 51/5281 |
| 9,461,269 B2* | 10/2016 | Lee | H01L 51/524 |
| 9,626,063 B2* | 4/2017 | Choi | H01L 27/3248 |
| 9,647,233 B2 | 5/2017 | Kim et al. | |
| 9,698,378 B2* | 7/2017 | Cho | H05B 33/04 |
| 9,704,933 B2 | 7/2017 | Sato | |
| 9,710,090 B2* | 7/2017 | Choi | G06F 3/0412 |
| 9,720,449 B2* | 8/2017 | Ko | G06F 1/1652 |
| 9,741,952 B2* | 8/2017 | Namkung | H01L 51/5237 |
| 9,823,770 B2 | 11/2017 | Lee et al. | |
| 9,893,312 B2* | 2/2018 | Park | H01L 51/5253 |
| 9,965,069 B2 | 5/2018 | Song et al. | |
| 10,021,741 B2* | 7/2018 | Lee | C23C 16/401 |
| 10,043,997 B2* | 8/2018 | Ono | H01L 27/3276 |
| 10,168,844 B2* | 1/2019 | Kwon | H01L 27/3279 |
| 10,305,067 B2* | 5/2019 | Grabowski | H01L 51/0097 |
| 10,326,110 B2* | 6/2019 | Kwon | H01L 51/5246 |
| 10,396,309 B2* | 8/2019 | Kim | H01L 27/3244 |
| 10,454,068 B2* | 10/2019 | Lee | H01L 51/5284 |
| 10,468,626 B2* | 11/2019 | Lee | H01L 51/5253 |
| 10,516,139 B2* | 12/2019 | Kim | H01L 51/56 |
| 10,529,948 B2* | 1/2020 | Sonoda | H01L 51/0097 |
| 10,572,057 B2* | 2/2020 | Lee | G06F 3/0443 |
| 10,615,376 B2* | 4/2020 | Giraldo | G02B 5/3016 |
| 10,741,800 B2* | 8/2020 | Kishimoto | H01L 51/5237 |
| 10,879,317 B2* | 12/2020 | Yun | H01L 27/322 |
| 10,910,590 B2* | 2/2021 | Harikrishna Mohan | H01L 27/326 |
| 2010/0231554 A1 | 9/2010 | Anno et al. | |
| 2011/0193799 A1 | 8/2011 | Jun et al. | |
| 2014/0145155 A1 | 5/2014 | Park | |
| 2015/0049260 A1 | 2/2015 | Yashiro et al. | |
| 2015/0054803 A1 | 2/2015 | Yashiro et al. | |
| 2015/0160767 A1* | 6/2015 | Song | G09G 3/3208 345/174 |
| 2015/0187845 A1* | 7/2015 | Kim | H01L 27/3272 257/40 |
| 2016/0062520 A1 | 3/2016 | Choi | |
| 2016/0079329 A1* | 3/2016 | Lee | G06F 1/1643 257/40 |
| 2016/0087242 A1* | 3/2016 | Chen | H01L 51/5253 257/100 |
| 2016/0104867 A1* | 4/2016 | Lee | H01L 51/5253 438/34 |
| 2016/0226021 A1* | 8/2016 | Lee | H01L 51/5281 |
| 2016/0282978 A1* | 9/2016 | Wang | G06F 3/0443 |
| 2016/0284783 A1* | 9/2016 | Kim | H01L 27/3248 |
| 2016/0291780 A1 | 10/2016 | Namkung | |
| 2016/0306472 A1* | 10/2016 | Park | G06F 3/0446 |
| 2016/0313848 A1 | 10/2016 | Rhee | |
| 2016/0315284 A1 | 10/2016 | Jeon | |
| 2016/0322601 A1* | 11/2016 | Lee | H01L 51/5256 |
| 2016/0365522 A1* | 12/2016 | Seo | H01L 51/0097 |
| 2017/0012237 A1* | 1/2017 | Sun | H01L 51/0097 |
| 2017/0053973 A1 | 2/2017 | Park et al. | |
| 2017/0117346 A1* | 4/2017 | Kim | H01L 23/49555 |
| 2017/0256593 A1* | 9/2017 | Jung | G06F 3/0412 |
| 2017/0256739 A1* | 9/2017 | Kim | H01L 51/5253 |
| 2017/0278910 A1 | 9/2017 | Choi et al. | |
| 2017/0287995 A1* | 10/2017 | Kim | H01L 27/3276 |
| 2017/0338286 A1* | 11/2017 | Oh | H01L 27/323 |
| 2017/0344162 A1* | 11/2017 | Lee | G06F 3/0446 |
| 2017/0365814 A1* | 12/2017 | Kim | H01L 27/3276 |
| 2018/0006265 A1* | 1/2018 | Oh | H01L 51/5237 |
| 2018/0053905 A1* | 2/2018 | Lee | H01L 27/3262 |
| 2018/0061728 A1* | 3/2018 | Chen | H01L 51/5246 |
| 2018/0061898 A1* | 3/2018 | Oh | H01L 27/3246 |
| 2018/0061917 A1* | 3/2018 | Kim | H01L 51/0097 |
| 2018/0069194 A1* | 3/2018 | Ono | H01L 51/5253 |
| 2018/0095570 A1* | 4/2018 | Hong | H01L 51/5284 |
| 2018/0097198 A1* | 4/2018 | Chou | H01L 51/5253 |
| 2018/0101259 A1* | 4/2018 | No | G06F 3/0412 |
| 2018/0107316 A1* | 4/2018 | Hanari | G06F 3/0412 |
| 2018/0108710 A1* | 4/2018 | Lin | G06F 3/0412 |
| 2018/0114951 A1* | 4/2018 | Namkung | H01L 51/5281 |
| 2018/0120975 A1* | 5/2018 | Kim | G06F 3/04164 |
| 2018/0122890 A1* | 5/2018 | Park | H01L 27/3279 |
| 2018/0136527 A1* | 5/2018 | Park | H01L 51/0097 |
| 2018/0145125 A1* | 5/2018 | Lee | H01L 27/3276 |
| 2018/0145127 A1* | 5/2018 | Shin | H01L 51/5253 |
| 2018/0151663 A1* | 5/2018 | Kim | G09G 3/3233 |
| 2018/0159081 A1* | 6/2018 | Choi | G06F 3/0412 |
| 2018/0166526 A1* | 6/2018 | Kim | H01L 27/3246 |
| 2018/0226612 A1* | 8/2018 | Choi | H01L 27/3258 |
| 2018/0240849 A1* | 8/2018 | Kao | H01L 29/78696 |
| 2020/0050308 A1 | 2/2020 | Lee et al. | |

FOREIGN PATENT DOCUMENTS

| | | |
|---|---|---|
| JP | 2008-216975 | 9/2008 |
| KR | 10-2013-0141187 | 12/2013 |
| KR | 10-2015-0060015 | 6/2015 |
| KR | 10-2015-0066326 | 6/2015 |
| KR | 10-2016-0035669 | 4/2016 |
| KR | 10-2016-0050146 | 5/2016 |
| KR | 10-2016-0119934 | 10/2016 |
| KR | 10-2016-0127873 | 11/2016 |

OTHER PUBLICATIONS

Notice of Allowance dated Apr. 17, 2019, in U.S. Appl. No. 15/847,879.

Non-Final Office Action dated May 1, 2020, in U.S. Appl. No. 16/515,688.

Notice of Allowance dated Sep. 22, 2020, in U.S. Appl. No. 16/515,688.

* cited by examiner

DISPLAY DEVICE

CROSS-REFERENCE TO RELATED APPLICATIONS

This application is a continuation of U.S. patent application Ser. No. 16/515,688, filed Jul. 18, 2019, which is a continuation of U.S. patent application Ser. No. 15/847,879, filed on Dec. 19, 2017, now issued as U.S. Pat. No. 10,403,692, which claims priority to and the benefit of Korean Patent Application No. 10-2017-0034710, filed on Mar. 20, 2017, the entire content of all of which is incorporated herein by reference.

BACKGROUND

Field

The invention relates generally to a display device having an integrated touch screen display, and, more particularly, to a display device with an integrated touch display including a thin film encapsulation structure.

Discussion of the Background

Among various types of display devices, a display device using a self-luminous element generally has a fast response speed and can display a moving picture. Also, since a self-luminous element emits light by itself, a display device including a self-luminous element has a wide viewing angle and can achieve high luminance. Thus, a display device including a self-luminous element has been in the spotlight as a next-generation display device.

An electroluminescent unit using a self-luminous element typically includes a pixel electrode, an opposing electrode, and an electroluminescent layer interposed between the pixel electrode and the opposing electrode. However, an electroluminescent unit is generally very sensitive to moisture, oxygen, and the like. For example, when the electroluminescent unit contacts moisture, oxygen, and the like, display quality may be deteriorated due to damage to the electroluminescent unit. Therefore, a thin film encapsulation structure is typically used as a sealing process for blocking external moisture, oxygen, and/and the like from entering the electroluminescent layer of the electroluminescent unit.

Meanwhile, recent consumer demands often require display devices to be flexible and bendable and have an input unit capable of receiving a user's command, such as a touch screen panel, in addition to an output function for displaying an image.

The above information disclosed in this Background section is only for enhancement of understanding of the background of the inventive concepts, and, therefore, it may contain information that does not form the prior art that is already known in this country to a person of ordinary skill in the art.

SUMMARY

Applicants have discovered that integrating a touch panel in a display device having flexible films instead of upper and lower substrate can result in deterioration of the thin film encapsulating structure, which can produce corresponding deterioration of display quality. Display devices constructed according to the principles of the invention are capable of easily integrating a touch panel on a thin film encapsulation structure and minimizing the risk of deterioration of encapsulating structures that protect the light emitting unit. Therefore, display quality may increase. In one particularly advantageous design, the encapsulation structure may be formed by a flexible encapsulation multilayer with direct bonding between inorganic materials.

Additional aspects will be set forth in the detailed description which follows, and, in part, will be apparent from the disclosure or may be learned by practice of the inventive concepts.

Aspects of the present disclosure provide a display device in which a touch panel is easily integrated on a thin film encapsulation structure without a substantial deterioration of encapsulating characteristics of the thin film encapsulation structure.

According to one aspect of the invention, an electroluminescent device may comprise a lower structure, a flexible encapsulation multilayer, and a touch panel. The lower structure may have an emission area and a peripheral area completely surrounding the emission area, and may comprise an insulation film and an electroluminescent unit having a lower electrode located on the insulation film, an intermediate film located on the lower electrode, and an upper electrode located on the intermediate film. The flexible encapsulation multilayer may be located on the emission area and the peripheral area of the lower structure, and may include at least three layers. The touch panel may be located on the flexible encapsulation multilayer, and may have a touch electrode. The peripheral area may include a lower electrode power supply terminal, a lower electrode power supply wire electrically connecting the lower electrode to the lower electrode power supply terminal, an upper electrode power supply terminal, an upper electrode power supply wire electrically connecting the upper electrode to the upper electrode power supply terminal, a touch terminal, and a touch wire electrically connecting the touch electrode to the touch terminal. The flexible encapsulation multilayer may include a lower surface comprising only one or more inorganic materials. The peripheral area may include an inorganic surface portion comprising only one or more inorganic materials, located outside the upper electrode in a plan view, and having a first inorganic surface branch completely surrounding the emission area in a plan view. An entire of the inorganic surface portion may directly contact the lower surface of the flexible encapsulation multilayer. The lower structure may include a lower encapsulating inorganic film horizontally expanding to vertically correspond to the emission area and the peripheral area and located substantially not higher than an upper surface of the lower structure. A portion located between a lower surface of the lower encapsulating inorganic film and the entire of the inorganic surface portion may not comprise an organic material. The touch wire may comprise a first portion overlapping the lower electrode power supply wire and a second portion overlapping the upper electrode power supply wire.

In exemplary embodiments of the invention, the peripheral area may include a first organic surface portion completely surrounding the emission area in a plan view, completely surrounded by the inorganic surface portion in a plan view, and located outside the upper electrode in a plan view. The peripheral area may include a second organic surface portion extending along the peripheral area such that the emission area is not completely surrounded by the second organic surface portion in a plan view, completely surrounded by the inorganic surface portion in a plan view, and located outside the upper electrode in a plan view. The first and second organic surface portions may be spaced apart from each other in a plan view. The first organic surface portion may have an edge and the entire edge of the first organic surface portion may directly contact the inorganic surface portion in a plan view. The second organic surface portion may have an edge and the entire edge of the second organic surface portion may directly contact the inorganic surface portion in a plan view.

In exemplary embodiments of the invention, the second organic surface portion may partially surround the emission area in a plan view.

In exemplary embodiments of the invention, the second organic surface portion may have only one opening to discontinuously surround the emission area in a plan view.

In exemplary embodiments of the invention, the peripheral area may include an organic surface portion completely surrounding the emission area in a plan view, and located outside the upper electrode in a plan view. The lower surface of the flexible encapsulation multilayer may directly contact the organic surface portion such that the organic surface portion is partially covered by the lower surface of the flexible encapsulation multilayer. The organic surface portion may include an inner edge having at least a portion directly contacting the inorganic surface portion in a plan view. The organic surface portion may include an outer edge having a first portion which directly contacts the inorganic surface portion in a plan view and a second portion which does not directly contact the inorganic surface portion in a plan view.

In exemplary embodiments of the invention, the inorganic surface portion may include a second inorganic surface branch extending along the peripheral area such that the emission area is not completely surrounded by the second inorganic surface branch in a plan view. The second inorganic surface branch may have an inner edge. The entire inner edge of the second inorganic surface branch may directly contact an outer edge of the organic surface portion in a plan view. The second inorganic surface branch may be spaced apart from the first inorganic surface branch in a plan view.

In exemplary embodiments of the invention, the second inorganic surface branch may partially surround the emission area in a plan view.

In exemplary embodiments of the invention, the upper electrode power supply wire may include a bus wire and an auxiliary upper electrode which extends along a periphery of the emission area. The auxiliary upper electrode may have a lower surface facing a top surface of the bus wire to electrically communicate with the top surface of the bus wire and a top surface facing a lower surface of the upper electrode to electrically communicate with the lower surface of the upper electrode. The lower structure may further comprise a peripheral circuit located under the auxiliary upper electrode in the peripheral area. A portion of the touch wire may extend substantially along the periphery of the emission area and may overlap both the auxiliary upper electrode and the peripheral circuit.

In exemplary embodiments of the invention, widths of the portions of the touch wires may decrease in a direction substantially perpendicular to a direction in which the touch wires extend.

In exemplary embodiments of the invention, the peripheral area may further include an auxiliary touch wire electrically connected to the touch wire and overlapping the portion of the touch wire.

In exemplary embodiments of the invention, at least one of the lower electrode power supply terminals, at least one of the touch terminals, and at least one of the upper electrode power supply terminals may be located in a terminal area of the peripheral area. The peripheral area may include a bendable area extending between the emission area and the terminal area. At least one selected from a group of the lower electrode power supply wire, the upper electrode power supply wire, and the touch wire may include a conductive bridge for transmitting an electrical signal through the bendable area. The conductive bridge may be formed in a different layer from at least a portion of the rest of the at least one selected from the group of the lower electrode power supply wire, the upper electrode power supply wire, and the touch wire.

In exemplary embodiments of the invention, the touch wire may further comprise a third portion overlapping the upper electrode power supply wire. The first portion of the touch wire may be located between the second and third portions of the touch wire.

In exemplary embodiments of the invention, the third portion of the touch wire may overlap an end portion of the upper electrode power supply wire.

In exemplary embodiments of the invention, at least one of the lower electrode power supply terminals, at least one of the touch terminals, and at least one of the upper electrode power supply terminals may be located in a terminal area of the peripheral area and may have substantially the same heights to be electrically connected to one external circuit board.

In exemplary embodiments of the invention, the at least one of the touch terminals may be located between the at least one of the lower electrode power supply terminals and the at least one of the upper electrode power supply terminals.

In exemplary embodiments of the invention, the peripheral area may include a bendable area extending between the emission area and the terminal area. The touch wire may not overlap the lower electrode power supply wire and the upper electrode power supply wire in the bendable area.

In exemplary embodiments of the invention, a size of the touch terminal may be substantially less than a size of the lower electrode power supply terminal or a size of the upper electrode power supply terminal.

In exemplary embodiments of the invention, at least one selected from a group of the lower electrode power supply terminal and the upper electrode power supply terminal may be located in a power terminal area of the peripheral area and electrically connected to a first external circuit board. The touch terminal may be located in a touch terminal area of the peripheral area and electrically connected to a second external circuit board. The power terminal area and the touch terminal area may be located at a side of the lower structure and may not overlap each other in a plan view. The first external circuit board and the second external circuit board may be located at the side of the lower structure and may not overlap each other in a plan view. A direction in which the first external circuit board is attached to the at least one selected from the group of the lower electrode power supply terminal and the upper electrode power supply terminal may be substantially the same as a direction in which the second external circuit board is attached to the touch terminal. The flexible encapsulation multilayer may include a first inorganic layer, an organic layer located on the first inorganic layer, and a second inorganic layer located on the organic layer. The touch terminal area may not overlap the organic layer in a plan view.

In exemplary embodiments of the invention, at least one selected from a group of the lower electrode power supply terminal and the upper electrode power supply terminal may be located in a power terminal area of the peripheral area to be electrically connected to a first external circuit board. The touch terminal may be located in a touch terminal area of the peripheral area to be electrically connected to a second external circuit board. The power terminal area and the touch terminal area may be located at a side of the lower structure and may not overlap each other in a plan view. The first external circuit board and the second external circuit board may be located at the side of the lower structure and may not overlap each other in a plan view. A direction in which the first external circuit board is attached to the at least one selected from the group of the lower electrode power supply terminal and the upper electrode power supply terminal may be substantially opposite to a direction in which the second external circuit board is attached to the touch terminal. The flexible encapsulation multilayer may include a first inorganic layer, an organic layer located on the first inorganic layer, and a second inorganic layer located on the organic layer. The touch terminal area may not overlap the organic layer in a plan view.

In exemplary embodiments of the invention, the entire inner edge of the organic surface portion may directly contact the inorganic surface portion in a plan view.

In exemplary embodiments of the invention, the first inorganic surface branch may be located substantially inner than the organic surface portion in a plan view.

According to another aspect of the invention, an electroluminescent device may comprise a lower structure, a flexible encapsulation multilayer, and a touch panel. The lower structure may have an emission area and a peripheral area surrounding the emission area, and may comprise an insulation film on an inorganic insulating film and an electroluminescent unit having a lower electrode disposed on the insulation film, an intermediate film disposed on the lower electrode, and an upper electrode disposed on the intermediate film. A flexible encapsulation multilayer may be disposed on the emission area and the peripheral area of the lower structure, and may include at least three layers. A touch panel may be disposed on the flexible encapsulation multilayer, and may have a touch electrode. The peripheral area may include a lower electrode power supply terminal, a lower electrode power supply wire electrically connecting the lower electrode to the lower electrode power supply terminal, an upper electrode power supply terminal, an upper electrode power supply wire electrically connecting the upper electrode to the upper electrode power supply terminal, a touch terminal, and a touch wire electrically connecting the touch electrode to the touch terminal. The flexible encapsulation multilayer may include a lower surface comprising only one or more inorganic materials. The peripheral area may include an inorganic surface portion substantially surrounding the emission area, disposed outside the upper electrode in a plan view, and comprising only one or more inorganic materials. An entire of the inorganic surface portion may directly contact the lower surface of the flexible encapsulation multilayer. The lower structure may include a lower encapsulating inorganic film horizontally expanding below a surface of the lower structure to vertically correspond to the emission area and the peripheral area, and a portion of the lower structure disposed between the lower encapsulating inorganic film and the entire of the inorganic surface portion may comprise only one or more inorganic materials. The lower encapsulating inorganic film may have a hole filled with an inorganic material substantially different from that of the lower encapsulating inorganic film. The touch wire may comprise a first portion overlapping the lower electrode power supply wire and a second portion overlapping the upper electrode power supply wire. The lower electrode may be disposed on a top surface of the insulation film, and the entire of the inorganic surface portion may be disposed to be relatively lower than the top surface of the insulation film. The inorganic surface portion may have at least a region including a plurality of inorganic surface branches which are spaced apart from each other. The peripheral area may further include an organic surface portion which is disposed between the inorganic surface branches, which comprises an organic material, which substantially surrounds the emission area, and which is substantially surrounded in a plan view by a direct contact interface between the inorganic surface portion and the lower surface of the flexible encapsulation multilayer. The inorganic surface branches may include an outer inorganic surface branch disposed relatively outer than the organic surface portion and an inner inorganic surface branch disposed relatively inner than the organic surface portion. The upper electrode power supply wire may comprise a bus wire extending on a top surface of the inorganic insulating film along a periphery of the emission area and an auxiliary upper electrode which extends on side and top surfaces of the insulation film along the periphery of the emission area to electrically contact both a top surface of the bus wire and a lower surface of the upper electrode.

In exemplary embodiments of the invention, the electroluminescent device may be capable of being flexed, bent, folded, rolled, or stretched by an end user.

In exemplary embodiments of the invention, the inorganic surface portion may include at least two stepped surface portions each including a top surface portion of the inorganic insulating film, a side surface portion of the bus wire, and a top surface portion of the bus wire. The bus wire may have an outer edge portion and an inner edge portion opposite to the outer edge portion. The outer edge portion of the bus wire may be relatively farther than the inner edge portion of the bus wire from the emission area. The outer edge portion of the bus wire may be disposed under the lower surface of the flexible encapsulation multilayer. The outer edge portion of the bus wire may be not in direct contact with the lower surface of the flexible encapsulation multilayer.

In exemplary embodiments of the invention, the inorganic surface portion may further include at least two stepped surface portions each including a top surface portion of the inorganic insulating film, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be disposed under the lower surface of the flexible encapsulation multilayer. The outer edge portion of the auxiliary upper electrode may be not in direct contact with the lower surface of the flexible encapsulation multilayer.

In exemplary embodiments of the invention, the inorganic surface portion may further include at least two stepped surface portions each including a top surface portion of the bus wire, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be disposed under the lower surface of the flexible encapsulation multilayer. The outer edge portion of the auxiliary upper electrode may be not in direct contact with the lower surface of the flexible encapsulation multilayer.

In exemplary embodiments of the invention, the inorganic surface portion may further include at least two stepped surface portions each including a top surface portion of the inorganic insulating film, a side surface portion of the auxiliary upper electrode, and a top surface portion of the auxiliary upper electrode. The inorganic surface portion may further include at least two stepped surface portions each including a top surface portion of the bus wire, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be disposed under the lower surface of the flexible encapsulation multilayer. The outer edge portion of the auxiliary upper electrode may be not in direct contact with the lower surface of the flexible encapsulation multilayer.

In exemplary embodiments of the invention, the inorganic surface portion may further include at least two stepped surface portions each including a top surface portion of the bus wire, a side surface portion of the auxiliary upper electrode, and a top surface portion of the auxiliary upper electrode. The auxiliary upper electrode may have an outer edge portion and an inner edge portion opposite to the outer edge portion. The outer edge portion of the auxiliary upper electrode may be relatively farther than the inner edge portion of the auxiliary upper electrode from the emission area. The outer edge portion of the auxiliary upper electrode may be disposed under the lower surface of the flexible encapsulation multilayer. The outer edge portion of the auxiliary upper electrode may be not in direct contact with the lower surface of the flexible encapsulation multilayer.

In exemplary embodiments of the invention, the inner inorganic surface branch may include at least a portion of a top surface of the auxiliary upper electrode to have a height relatively greater than a height of the outer inorganic surface branch. A portion of a surface of the bus wire may directly contact the lower surface of the flexible encapsulation multilayer. The portion of the surface of the bus wire may be relatively farther than the organic surface portion from the emission area.

In exemplary embodiments of the invention, the portion of the surface of the bus wire, which directly contacts the lower surface of the flexible encapsulation multilayer, may be included in the outer inorganic surface branch.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
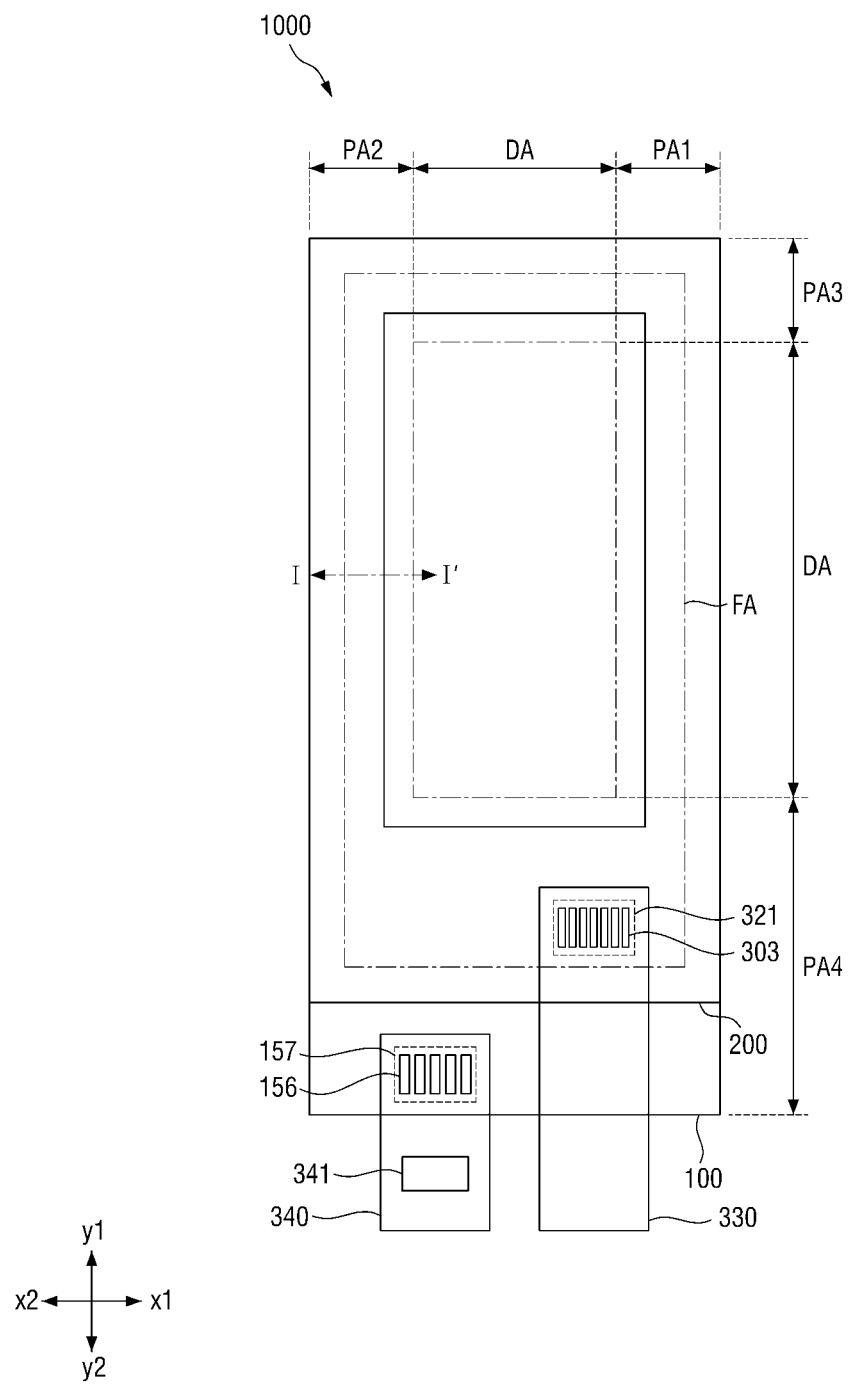
FIG. 1 is a plan view of an exemplary embodiment of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As used herein, the term of "comprising only an inorganic material" means that it comprises only one or more inorganic materials, but it does not mean that it comprises only one inorganic material.

Also, the term of "comprising only an organic material" means that it comprises only one or more organic materials, but it does not mean that it comprises only one organic material. The term of "'element' portion" means at least a portion of the entire 'element.' For example, the claimed term of "an inorganic surface portion" means at least a portion of the entire inorganic surface. Counting the number of 'element' portions is possible when the 'element' portions are separated from each other in a plan view such that merging the 'element' portions into one 'element' portion is not possible.

In embodiments of the present disclosure, the term of "surrounding" or "substantially surrounding" includes not only contiguously surrounding but also discontiguously surrounding. The term of "contiguously" is substantially the same as the term of "continuously." The term of "discontiguously" is substantially the same as the term of "discontinuously."

Hereinafter, various examples (exemplary embodiments) will be described with reference to the accompanying drawings.

Figure 2:
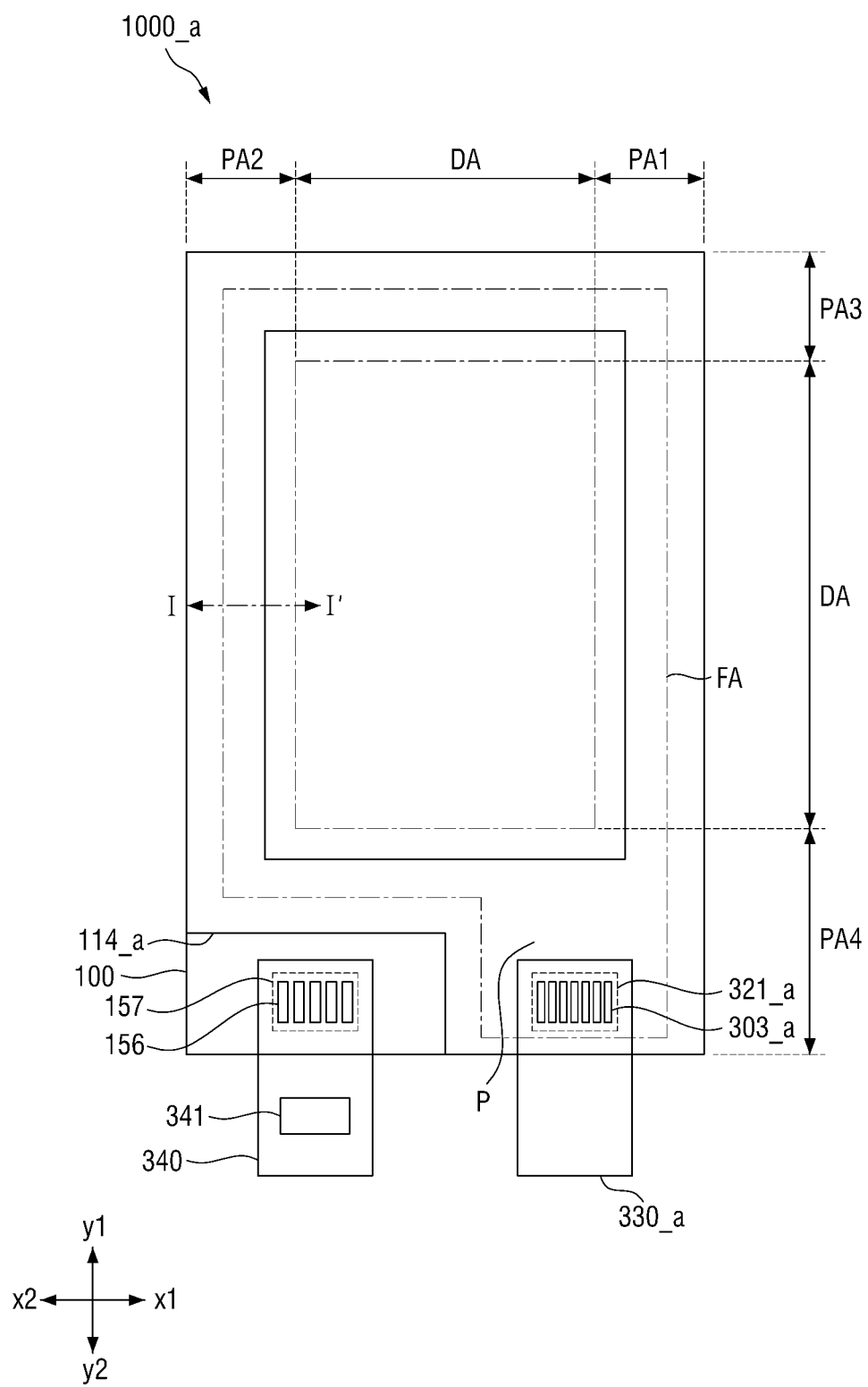
FIG. 2 is a plan view of an exemplary embodiment of a display device constructed according to the principles of the invention.
Figure 3:
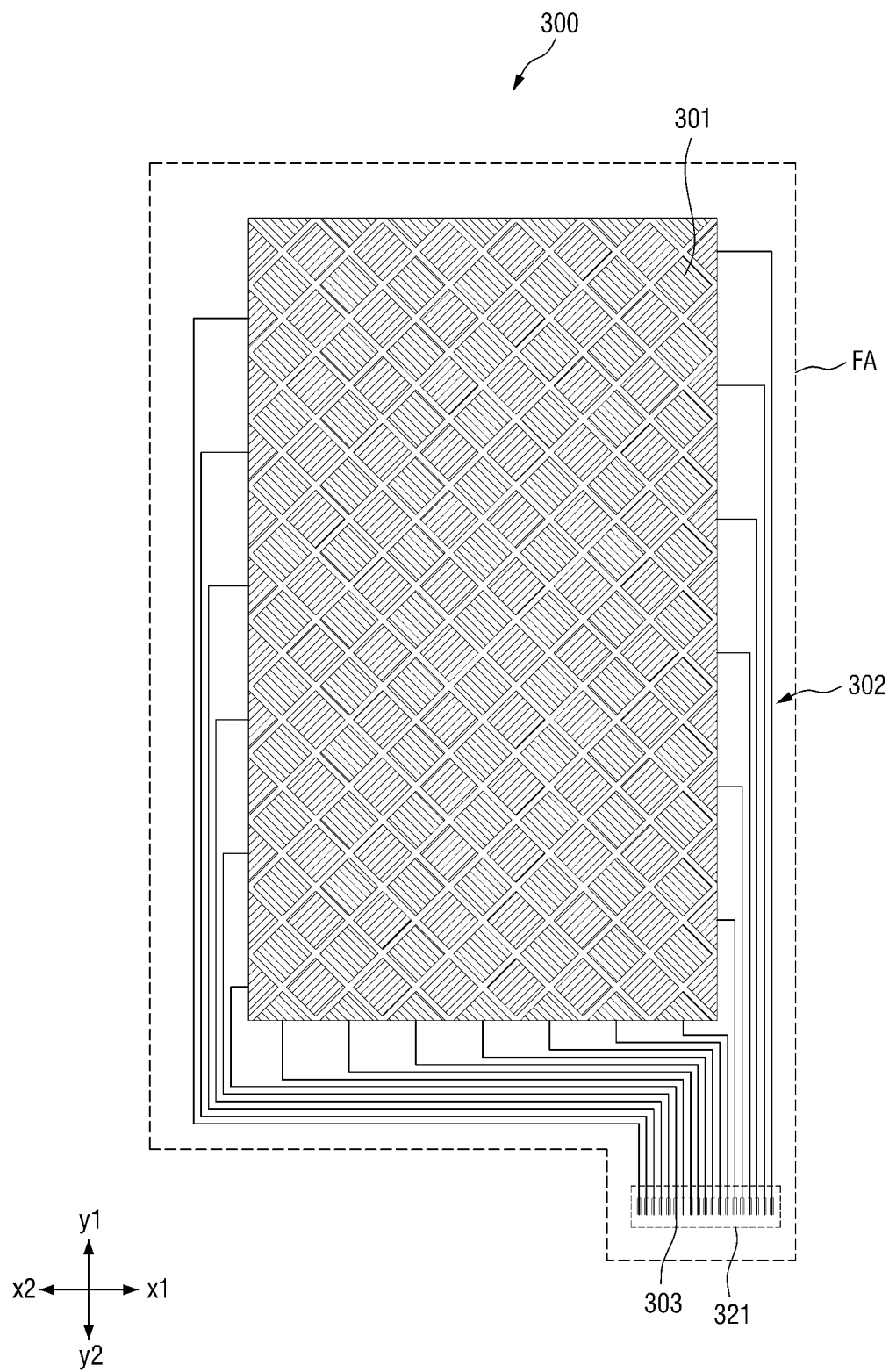
FIG. 3 is a plan view of a touch panel of FIG. 2.
Figure 4:
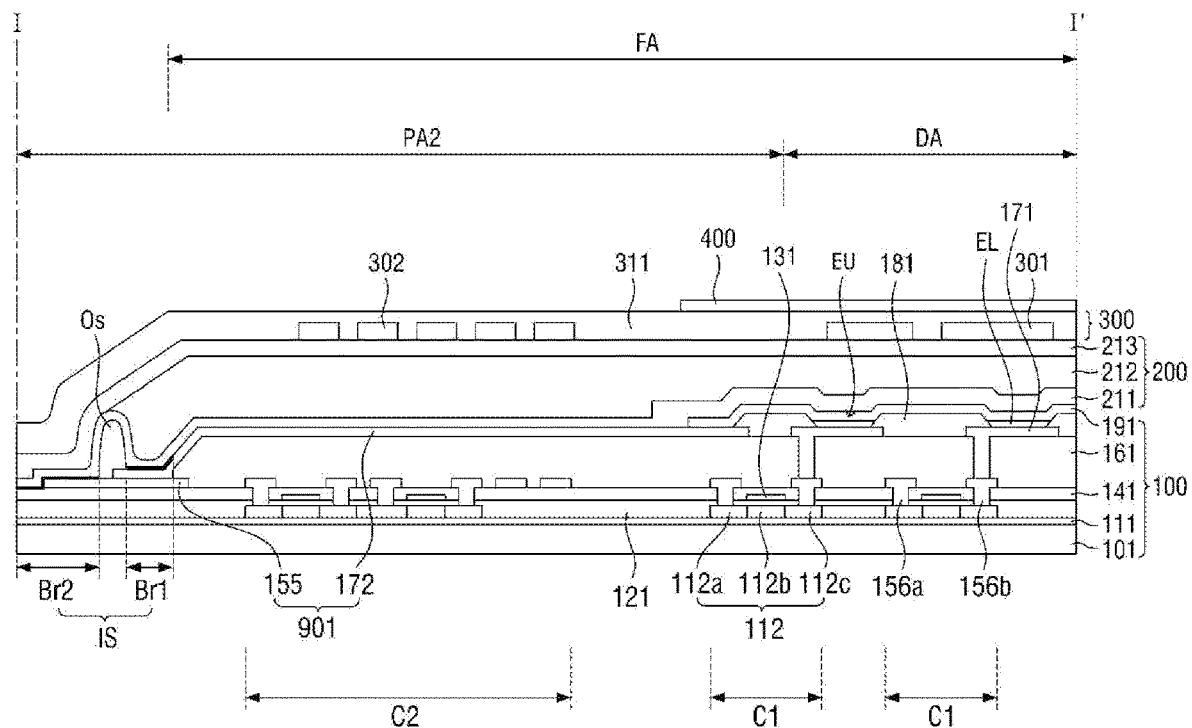
FIG. 4 is a cross-sectional view taken along line I-I' of FIGS. 1 and 2.

FIG. 1 is a plan view of an exemplary embodiment of a display device constructed according to the principles of the invention. FIG. 2 is a plan view of an exemplary embodiment of a display device constructed according to the principles of the invention. FIG. 3 is a plan view of a touch panel of FIG. 2. FIG. 4 is a cross-sectional view taken along line I-I' of FIGS. 1 and 2.

Referring to FIGS. 1 to 4, each display device 1000 and 1000_a includes a substrate 101, a pixel thin film transistor (PC-TFT) array formed on the substrate 101, an electroluminescent unit EU, and a flexible encapsulation multilayer 200 for encapsulating the electroluminescent unit EU.

The substrate 101 may support the entire display device 1000 and 1000_a and maintain rigidity. The substrate 101 may comprise a transparent insulating material and may have a substantially flat top surface. For example, the substrate 101 may comprise glass. However, the inventive concepts are not limited thereto and the substrate 101 may comprise a plastic material, such as polyethersulphone (PES), polyacrylate (PAR), and the like. Alternatively, the substrate 101 may comprise an opaque material, such as metal or carbon fiber. In order to construct a flexible display device, the substrate 101 may comprise a flexible plastic material, such as a polyimide (PI) film.

The substrate 101 is divided into a display area DA and a peripheral area PA1 to PA4 around the display area DA. The display area DA may display an image and is disposed at the center of the substrate 101. The peripheral area PA1 to PA4 may not display an image and is disposed at the edge of the substrate 101 to surround the display area DA.

The peripheral area includes a first peripheral area PA1, a second peripheral area PA2, a third peripheral area PA3, and a fourth peripheral area PA4. More specifically, as shown in FIGS. 1 and 2, a direction extending rightward is defined as a first direction x1, a direction extending leftward is defined as a second direction x2, a direction extending upward is defined as a third direction y1, and a direction extending downward is defined as a fourth direction y2. The first direction x1 and the second direction x2 may be opposite to each other. The third direction y1 and the fourth direction y2 may be opposite to each other. One of the first direction x1 and the second direction x2 and one of the third direction y1 and the fourth direction y2 may be perpendicular to each other.

The first peripheral area PA1 is disposed adjacent to the outside of a lower structure 100 in the first direction x1. The second peripheral area PA2 is disposed adjacent to the outside of the lower structure 100 in the second direction x2.

The third peripheral area PA3 is disposed adjacent to the outside of the lower structure 100 in the third direction y1. The fourth peripheral area PA4 is disposed adjacent to the outside of the lower structure 100 in the fourth direction y2.

In the display area DA, a plurality of electroluminescent units EU, which emit light for displaying an image are disposed for respective pixels. In the first to fourth peripheral areas PA1, PA2, PA3, and PA4, an upper electrode power supply wire 901 is formed to apply an electric signal or power to an upper electrode 191 of the electroluminescent unit EU. The upper electrode power supply wire 901 includes a bus wire 155 and an auxiliary upper electrode 172. Hereinafter, components disposed in the display area DA and the first to fourth peripheral areas PA1, PA2, PA3, and PA4 will be described in the order in which they may be sequentially formed on the substrate 101.

A buffer film 111 is formed on the substrate 101. The buffer film 111 may make the upper surface of the substrate 101 smooth and may block the penetration of impurities. The buffer film 111 may be a multilayer or a single layer and may comprise an inorganic material. Examples of the inorganic material may comprise silicon oxide (SiOx), silicon oxynitride, silicon nitride (SiNx), and a combination thereof. The buffer film 111 may be formed by various deposition methods. The buffer film 111 may be omitted if desired.

A pixel circuit C1 is formed on the buffer film 111. The pixel circuit C1 includes at least one pixel thin film transistor (PC-TFT). The pixel thin film transistor (PC-TFT) is electrically connected to the electroluminescent unit EU to drive the electroluminescent unit EU. The pixel circuit C1 may further include at least one capacitor.

The pixel thin film transistor (PC-TFT) is a top gate type TFT in which an active layer 112, a gate electrode 131, a source electrode 156a, and a drain electrode 156b are sequentially formed. However, the inventive concepts are not limited thereto and various types of pixel thin film transistors (PC-TFTs), such as a bottom gate type, may be employed.

The active layer 112 is formed on the buffer film 111. The active layer 112 includes a semiconductor material. Examples of the semiconductor material may include amorphous silicon or poly crystalline silicon. However, the inventive concepts are not limited thereto and the active layer 112 may comprise an oxide semiconductor material. Examples of the oxide semiconductor material may include G-I-Z-O $[(In2O3)_a(Ga2O3)_b(ZnO)_c]$ (a, b, and c are real numbers satisfying the conditions of a≥0, b≥0, c>0, respectively). The active layer 112 may include, in addition to GIZO, an oxide of a material selected from among 12-, 13-, and 14-group metallic elements, such as zinc (Zn), indium (In), gallium (Ga), tin (Sn), cadmium (Cd), germanium (Ge), and hafnium (Hf), or a combination thereof. The active layer 112 includes a source region 112a and a drain region 112c in contact with the source electrode 156a and the drain electrode 156b, respectively. The active layer 112 includes a channel region 112b disposed between the source region 112a and the drain region 112c. When the active layer 112 includes amorphous silicon or polycrystalline silicon, the source region 112a and the drain region 112c may be doped with impurities, if necessary.

A gate insulating film 121 is formed on the active layer 112. The gate insulating film 121 may be a multilayer or a single layer and may comprise an inorganic material, such as silicon oxide, silicon oxynitride, and/or silicon nitride. The gate insulating film 121 may insulate the active layer 112 from the gate electrode 131.

The gate electrode 131 is formed on the gate insulating film 121. The gate electrode 131 is connected to a gate line (not shown) for applying an on/off signal to the pixel thin film transistor (PC-TFT). The gate electrode 131 may comprise a metal material having a relatively low resistance. The gate electrode 131 may be a multilayer or a single layer and may comprise a conductive material. Examples of the conductive material may include molybdenum (Mo), aluminum (Al), copper (Cu), titanium (Ti), and the like.

An interlayer insulating film 141 is formed on the gate electrode 131. The interlayer insulating film 141 may insulate the gate electrode 131 from the source and drain electrodes 156a and 156b. The interlayer insulating film 141 may be a multilayer or a single layer and may comprise an inorganic material, such as a metal oxide and a metal nitride. Specific examples of the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), or a combination thereof.

The source electrode 156a and the drain electrode 156b are formed on the interlayer insulating film 141. The source electrode 156a and the drain electrode 156b are in contact with the source region 112a and the drain region 112c of the active layer 112, respectively, through contact holes formed through the gate insulating film 121 and the interlayer insulating film 141.

A planarization film 161 is formed on the pixel thin film transistor (PC-TFT). The planarization film 161 may be a single layer or a multilayer and may comprise an organic material. The organic material may be a general purpose polymer. Examples of the general purpose polymer may comprise polymethylmethacrylate (PMMA), polystyrene (PS), a polymer derivative having a phenol group, an acrylic polymer, an imide polymer, an arylether polymer, an amide polymer, a fluorine polymer, a p-xylene polymer, a vinyl alcohol polymer, or a combination thereof. The planarization film 161 may reduce or eliminate a step caused by the pixel thin film transistor (PC-TFT) array and makes the top surface substantially flat, thereby preventing or minimizing the occurrence of defects in the electroluminescent unit EU due to unevenness at its bottom portion. Further, the planarization film 161 may function as an insulating film that blocks electrical connection between the components separated by the planarization film 161.

The electroluminescent unit EU is formed on a portion of the upper surface of the planarization film 161 corresponding to the display area DA. The electroluminescent unit EU includes a lower electrode 171 formed on the planarization film 161, the upper electrode 191 facing the lower electrode 171, and an electroluminescent layer EL interposed between the lower and upper electrodes 171 and 191. The electroluminescent layer EL may include an organic material. The display devices 1000 and 1000_a may be classified into a bottom emission type, a top emission type, and a dual emission type according to the emission direction of the electroluminescent unit EU. In the bottom emission type, the lower electrode 171 is provided as a transparent or semi-transparent electrode for transmitting light and the upper electrode 191 is provided as a reflective electrode for reflecting light. In the top emission type, the lower electrode 171 is provided as a reflective electrode and the upper electrode 191 is provided as a transparent or semi-transparent electrode. In the dual emission type, both of the lower electrode 171 and the upper electrode 191 may be transparent or semi-transparent electrodes.

When the lower electrode 171 functions as an anode, the lower electrode 171 may include a conductive material having a relatively high work function. Examples of the conductive material may comprise indium tin oxide (ITO), indium zinc oxide (IZO), zinc oxide (ZnO), indium oxide (In2O3), indium gallium oxide (IGO), aluminum zinc oxide (AZO), or a combination thereof. The lower electrode 171 may be patterned into an island shape corresponding to each pixel. Further, the lower electrode 171 may be connected to the drain electrode 156b of the pixel TFT (PC-TFT) to receive a current.

Meanwhile, a pixel defining layer (PDL) 181 is formed on the lower electrode 171 and covers the lower electrode 171. The pixel defining layer 181 may comprise one or more organic insulating materials. Examples of the one or more organic insulating materials may comprise polyimide, polyamide, acrylic resin, benzocyclobutene, phenol resin, or a combination thereof. The pixel defining layer 181 may be formed by a spin coating method, and the like. A predetermined opening for defining a pixel is formed on the pixel defining layer 181. The electroluminescent layer EL is formed at least in a region defined by the opening. In some exemplary embodiments, the pixel defining layer 181 is used to form a light emitting layer by a solution technique, such as an ink jet and nozzle printing method, and includes a partition having a relatively high height.

The electroluminescent layer EL may include a low molecular organic material or a polymer organic material that emits red, green, or blue light. A hole transport layer (HTL) and/or a hole injection layer (HIL) may be disposed between the electroluminescent layer EL and the lower electrode 171. Further, an electron transport layer (ETL) and/or an electron injection layer (EIL) may be disposed between the electroluminescent layer EL and the upper electrode 191. Various layers other than the hole injection layer (HIL), the hole transport layer (HTL), the electron transport layer (ETL), and the electron injection layer (EIL) may be stacked as needed.

Although the electroluminescent layer EL is described as being formed for each pixel such that red, green, and blue light may be emitted individually from each pixel and a pixel group for emitting red, green, and blue light may form one unit pixel, however, the inventive concepts are not limited thereto and, thus, the electroluminescent layer EL may be formed in common throughout the pixel. For example, a plurality of electroluminescent layers EL emitting red, green, and blue light may be vertically stacked or mixed to form white light. The combination of colors for emitting white light is not limited thereto. In this case, a color conversion layer or a color filter for converting the emitted white light into a predetermined color may be separately provided.

The upper electrode 191 may comprise a conductive inorganic material. When the upper electrode 191 functions as a cathode, the upper electrode 191 may comprise Al, Mg, Ag, and the like having a relatively small work function. The upper electrode 191 may be formed as a common electrode over the entire display area DA. In this case, the upper electrode 191 may be formed by an evaporation process that does not damage the electroluminescent layer EL. The polarities of the lower electrode 171 and the upper electrode 191 may be opposite to each other.

The upper electrode 191 may be connected to the upper electrode power supply wire 901 disposed in the first to fourth peripheral areas PA1, PA2, PA3, and PA4 to receive an electrical signal or power. The upper electrode power supply wire 901 includes the bus wire 155 and the auxiliary upper electrode 172.

The bus wire 155 applies the electric signal or power supplied from the outside to the upper electrode 191. Therefore, the bus wire 155 comprises a conductive inorganic material through which a current may flow easily and may be formed to have a single layer or a multilayer structure. Examples of the conductive inorganic material may comprise aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a combination thereof. The bus wire 155 is formed on the interlayer insulating film 141. The bus wire 155 may be formed at the same time when the source electrode 156a and the drain electrode 156b of the pixel thin film transistor (PC-TFT) are formed. In this case, the bus wire 155 may comprise the same conductive inorganic material as the source electrode 156a and the drain electrode 156b.

The bus wire 155 should be electrically connected to the upper electrode 191. However, the bus wire 155 and the upper electrode 191 are spaced apart from each other because the bus wire 155 and the upper electrode 191 are formed on different layers. Therefore, the auxiliary upper electrode 172 may electrically connect the bus wire 155 and the upper electrode 191.

The auxiliary upper electrode 172 is in contact with the bus wire 155 and the upper electrode 191 to transmit the electric signal or power supplied from the bus wire 155 to the upper electrode 191. The auxiliary upper electrode 172 may function as a bridge, or a link. Therefore, the auxiliary upper electrode 172 comprises a conductive inorganic material through which a current may flow easily and may be formed to have a single layer or a multilayer structure. Examples of the conductive inorganic material may comprise aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a combination thereof. The side surfaces of the planarization film 161 are disposed in the first to fourth peripheral areas PA1, PA2, PA3, and PA4. The auxiliary upper electrode 172 is disposed along the side surfaces and the upper surface of the planarization film 161. According to an exemplary embodiment, the auxiliary upper electrode 172 may be formed together with the lower electrode 171 by using the same material as the lower electrode 171.

The auxiliary upper electrode 172 may extend along the periphery of the display area DA. Specifically, the auxiliary upper electrode 172 has a shape surrounding or substantially surrounding the display area DA in the first to fourth peripheral areas PA1, PA2, PA3, and PA4 to prevent a dynamic voltage (IR) drop. As used herein, the term of "surrounding" is synonymous with "substantially surrounding" with respect to the shape of the auxiliary upper electrode 172 and refers to completely surrounding or partially surrounding, provided the configuration prevents or significantly reduces an IR drop. In order to increase the contact area between the auxiliary upper electrode 172 and the bus wire 155, the bus wire 155 may also extend along the periphery of the display area DA in the first to fourth peripheral areas PA1, PA2, PA3, and PA4. Specifically, the bus wire 155 may have a shape substantially surrounding the display area DA in the first to fourth peripheral areas PA1, PA2, PA3, and PA4.

The flexible encapsulation multilayer 200 is formed over the entire surface of the substrate 101 to cover all of the display area DA and the first to fourth peripheral areas PA1, PA2, PA3, and PA4. Alternatively, the flexible encapsulation multilayer 200 may be formed on the substrate 101 and cover all of the display area DA and at least a part of the first to fourth peripheral areas PA1, PA2, PA3, and PA4. The flexible encapsulation multilayer 200 protects the electroluminescent unit EU from external moisture, oxygen, and the like. The flexible encapsulation multilayer 200 may include a first inorganic layer 211, an organic layer 212 on the first inorganic layer 211, and a second inorganic layer 213 on the organic layer 212. Here, the organic layer 212 may have a substantially flat upper surface such that the second the second inorganic layer 213 disposed thereon has a substantially flat area FA.

However, the flexible encapsulation multilayer 200 is not limited to a structure having three stacked layers as shown in the FIG. 4. The flexible encapsulation multilayer 200 may be formed by sequentially stacking a first inorganic layer, a first organic layer, a second inorganic layer, a second organic layer, and a third inorganic layer from the top of the electroluminescent unit EU. Here, the first organic layer may have a relatively less area than the second inorganic layer and the second organic layer may have a relatively less area than the third inorganic layer. Still alternatively, the flexible encapsulation multilayer 200 may be formed by sequentially stacking a first inorganic layer, a first organic layer, a second inorganic layer, a second organic layer, a third inorganic layer, a third organic layer, and a fourth inorganic layer from the top of the electroluminescent unit EU. In this case, the first organic layer may the display area DA and the first to fourth peripheral areas PA1, PA2, PA3, and PA4 be completely covered with the second inorganic layer, the second organic layer may be completely covered with the third inorganic layer and the third organic layer may be completely covered with the fourth inorganic layer. As such, the area of the third inorganic layer is relatively wider than the areas of the first inorganic layer, the first organic layer, the second inorganic layer, and the second organic layer, so that the third inorganic layer may cover the edges of the first inorganic layer, the first organic layer, the second inorganic layer, and the second organic layer.

As described above, the flexible encapsulation multilayer 200 may have various structures and the lower surface of the flexible encapsulation multilayer 200 may comprise only one or more inorganic materials.

The flexible encapsulation multilayer 200 may protect the electroluminescent unit EU of the display area DA from external moisture and/or oxygen, even when the lower structure 100 is encapsulated by the flexible encapsulation multilayer 200 alone. That is, without using any additional encapsulation member for preventing penetration of moisture and/or oxygen in addition to the flexible encapsulation multilayer 200, the flexible encapsulation multilayer 200 alone may encapsulate the electroluminescent unit EU to provide a reliable display device capable of preventing display defects caused by infiltration of external moisture and/or oxygen. The flexible encapsulation multilayer 200 may include a plurality of films. However, the "flexible encapsulation multilayer 200" may alternatively include a single film having an excellent encapsulating ability.

The first to fourth peripheral areas PA1, PA2, PA3, and PA4 include an inorganic surface portion IS, which may have a substantially looped or closed shape, for example, which contiguously surrounds the display area DA. The inorganic surface portion IS directly contacts the lower surface of the flexible encapsulation multilayer 200 (e.g., the lower surface of the first inorganic layer 211). Since the inorganic surface portion IS includes only one or more inorganic materials and the lower surface of the flexible encapsulation multilayer 200 (e.g., the lower surface of the first inorganic layer 211) also includes only one or more inorganic materials, a direct bonding between the inorganic surface portion IS and the lower surface of the flexible encapsulation multilayer 200 is an inorganic-inorganic direct bonding.

The inorganic surface portion IS may be disposed in the first to fourth peripheral areas PA1, PA2, PA3, and PA4 and may have a shape contiguously surrounding the display area DA as described above. That is, the inorganic surface portion IS may have a substantially closed shape such that the display area DA is disposed inside the inorganic surface portion IS.

The inorganic surface portion IS may include only one inorganic material. Alternatively, the inorganic surface portion IS may include a plurality of inorganic materials. The inorganic material constituting the inorganic surface portion IS may originate from at least one of, for example, the buffer film 111, the gate insulating film 121, and the interlayer insulating film 141. That is, a surface portion of the buffer film 111, a surface portion of the gate insulating film 121, and/or a surface portion of the interlayer insulating film 141 may be included in the inorganic surface portion IS. In this case, the inorganic material constituting the inorganic surface portion IS may be silicon nitride, or silicon oxynitride which have a relatively low moisture and oxygen permeability. Further, the inorganic material constituting the inorganic surface portion IS may originate from the bus wire 155 and/or the auxiliary upper electrode 172. That is, a surface portion of the bus wire 155 and/or a surface portion of the auxiliary upper electrode 172 may be included in the inorganic surface portion IS. In this case, the inorganic material constituting the inorganic surface portion IS may be a conductive inorganic material. Examples of the conductive inorganic material may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a combination thereof.

The lower structure 100 may include a lower encapsulating inorganic film horizontally expanding below the surface portion of the lower structure 100 to vertically correspond to the display area DA and the first to fourth peripheral areas PA1, PA2, PA3, and PA4. A portion of the lower structure 100 disposed between the inorganic surface portion IS and the lower encapsulating inorganic film may include only one or more inorganic materials. The lower encapsulating inorganic film may be, for example, the buffer film 111, the gate insulating film 121, or the interlayer insulating film 141. Here, the lower encapsulating inorganic film may include silicon nitride, or silicon oxynitride which have a relatively low moisture and oxygen permeability. The lower encapsulating inorganic film may include at least one hole filled with an inorganic material different from the inorganic material included in the lower encapsulating inorganic film.

An upper portion of the components disposed over the substrate 101 is encapsulated by the flexible encapsulation multilayer 200. A lower portion of the components disposed over the substrate 101 is encapsulated by the lower encapsulating inorganic film, such as the buffer film 111, the gate insulating film 121, and the interlayer insulating film 141. A side portion of the components disposed over the substrate 101 is encapsulated by a portion of the lower structure 100 which comprises only one or more inorganic materials and which is disposed between the inorganic surface portion IS and the lower encapsulating inorganic film. In this manner, a complete inorganic encapsulation structure may be obtained.

The planarization film 161 may comprise an organic material. An inorganic film formed by a process, such as chemical vapor deposition (CVD), and physical vapor deposition (PVD), is difficult to have a flat upper surface as compared with an organic film formed by a solution process, such as a spin coating method, and an inkjet coating method. When an inorganic material is used to form the planarization film 161 of a multilayered structure or a single layered structure, in order to allow the planarization film 161 to have a desired level of flatness, it is disadvantageously required that the height of the planarization film 161 should be relatively high. Thus, according to the exemplary embodiments, it is advantageous that the planarization film 161 comprises an organic material. In this case, the organic material may be interposed between the inorganic surface of the auxiliary upper electrode 172 and at least one of the buffer film 111, the gate insulating film 121, and the interlayer insulating film 141. Thus, the inorganic surface portion IS cannot be formed in a region where the planarization film 161 of the organic material is formed. As a result, according to the exemplary embodiments, the inorganic surface portion IS is disposed relatively lower than the upper surface of the planarization film 161. Here, the term of "being relatively low" includes the meaning that it is relatively closer to the substrate 101.

The inorganic surface portion IS may have a region divided into a plurality of inorganic surface branches Br1 and Br2 that are spaced apart from each other. The first to fourth peripheral areas PA1, PA2, PA3, and PA4 may include an organic surface portion Os disposed between the inorganic surface branches Br1 and Br2.

The organic surface portion Os may have a protruding shape extending upwardly. The organic surface portion Os has an upwardly protruding shape and overlaps with an edge portion of the organic layer 212, thereby increasing the height of the organic layer 212 at the edge portion of the organic layer 212. Therefore, the flat area FA on the surface of the second inorganic layer 213 included in the flexible encapsulation multilayer 200 may be effectively widened. Further, when the height of the organic surface portion Os is relatively high, the organic surface portion Os may function as a dam preventing the organic layer 212 from being pushed outward (e.g., outwardly of the lower structure 100) due to thermal or physical stress applied to the organic layer 212 of the flexible encapsulation multilayer 200. The organic surface portion Os and the inorganic surface portion IS will be described later with reference to FIGS. 5 to 10. A touch panel 300 is disposed on the flexible encapsulation multilayer 200. The touch panel 300 includes a plurality of touch electrodes 301, a plurality of touch wires 302 and a plurality of touch terminals 303. A protective insulating film 311 may be disposed on the touch electrodes 301 and the touch wires 302.

The upper surface of the second inorganic layer 213 of the flexible encapsulation multilayer 200 has a substantially flat area FA. The touch electrodes 301 are disposed on the flat area FA. The touch terminals 303 are disposed in a touch terminal area 321. The touch wires 302 extend to connect the touch electrodes 301 to the touch terminals 303 on the flat area FA.

When the touch electrodes 301 are formed on the flat area FA, touch sensitivity over the entire area of the touch panel 300 may be substantially uniform, as compared to when the touch electrode 301 is formed on a non-flat area (e.g., uneven area), which may cause uneven thicknesses in the touch electrodes 301.

As used herein, the touch wires 302 being disposed on the flat area FA refers to that all or most of the touch wires 302 being are disposed on the flat area FA. Further, it may also refer to all or most of the extended sections of one touch wire 302 being disposed on the flat area FA. For example, the touch wire 302 may be partially located in an area other than the flat area FA near a point where the touch wire 302 is connected to the touch terminal 303. The term "most" used herein refers to more than a half.

One touch wire 302 may be connected to one touch electrode 301. Accordingly, as the size of the touch panel 300 increases, the number of the touch electrodes 301 may be increased and, thus, the number of the touch wires 302 may also be increased. When the number of the touch wires 302 is increased, however, the area of the display area DA may be reduced accordingly. As such, the width of the touch wires 302 should be reduced as much as possible. In this case, when the touch wires 302 are formed on the flat area FA, the width of the touch wires 302 may be easily reduced during the manufacturing process, as compared to when the touch wires 302 are formed on a non-flat area.

According to the exemplary embodiments, the organic layer 212 of the flexible encapsulation multilayer 200 is disposed to overlap with the flat area FA defined on the second inorganic layer 213. In this case, the upper surface of the second inorganic layer 213 may be made substantially flat to form the flat area FA by using the organic layer 212 of the flexible encapsulation multilayer 200, without including a separate organic planarization film between the flexible encapsulation multilayer 200 and the touch panel 300. Further, even when a separate organic planarization film is formed between the flexible encapsulation multilayer 200 and the touch panel 300, since the organic layer 212 the flexible encapsulation multilayer 200 may assist planarization of the organic planarization film, the thickness of the organic planarization film may be reduced remarkably. Further, even when an inorganic insulating film having a relatively lower planarization capability than the organic planarization film is interposed between the flexible encapsulation multilayer 200 and the touch panel 300, the substantially flat area FA may be formed. Since an inorganic material may provide a greater protection against damage and the like, as compared to an organic material, the inorganic insulating film may prevent process damage from the flexible encapsulation multilayer 200 when the touch panel 300 is directly integrated on the flexible encapsulation multilayer 200.

A display terminal area 157, in which a plurality of display terminals 156 are disposed, is formed in the fourth peripheral area PA4 of the lower structure 100. The display terminals 156 may supply an electric signal or power for driving the electroluminescent unit EU disposed in the display area DA. The display terminals 156 disposed in the display terminal area 157 are in electrical contact with a display external circuit board 340. The display external circuit board 340 may be a flexible printed circuit board (FPCB).

Further, a semiconductor chip 341 may be disposed on the display external circuit board 340. A drive integrated circuit, and the like may be integrated in the semiconductor chip 341. If the semiconductor chip 341 is disposed on the lower structure 100, the semiconductor chip 341 may be broken when the lower structure 100 is folded and unfolded, because the semiconductor chip 341 is not flexible. Thus, according to the exemplary embodiments, the semiconductor chip 341 is disposed on the display external circuit board 340.

The touch terminals 303 disposed in the touch terminal area 321 are in electrical contact with a touch external circuit board 330. The touch external circuit board 330 may be a flexible printed circuit board.

A polarizing plate 400 may be disposed on the touch panel 300. In this case, the display terminal area 157 and the touch terminal area 321 may be disposed relatively outer than the polarizing plate 400 in a plan view. The flexible printed circuit board that may be used as the display external circuit board 340 or the touch external circuit board 330 is attached to a terminal during a process utilizing heat, such as thermal compression. Therefore, to prevent the polarizing plate 400 from being damaged by heat when attaching the flexible circuit board to the terminal, the display terminal area 157 and the touch terminal area 321 should be disposed relatively outer than the polarizing plate 400 in a plan view.

The touch terminal area 321 and the display terminal area 157 are disposed in different areas, as shown in FIGS. 1 and 2, to prevent the display external circuit board 340, and the touch external circuit board 330 from being overlapped with each other and damaged in a process of folding, and unfolding the display external circuit board 340, and the touch external circuit board 330. By forming the touch terminal area 321, and the display terminal area 157 in different areas, as shown in FIGS. 1 and 2, such that the display external circuit board 340 and the touch external circuit board 330 do not overlap each other, the display external circuit board 340 and the touch external circuit board 330 may be prevented from being contacting each other and being damaged, when the display external circuit board 340 and the touch external circuit board 330 are fixed to the lower surface of the lower structure 100.

According to the exemplary embodiments, the touch panel 300 may be directly integrated on the flexible encapsulation multilayer 200. By directly integrating the touch panel 300 on the flexible encapsulation multilayer 200, alignment errors that may occur when attaching the touch panel 300 to the flexible encapsulation multilayer 200 may be prevented and the manufacturing cost of the touch panel 300 may be reduced. Further, reduction of light transmittance due to an adhesive, which may occur when the touch panel 300 is attached to the flexible encapsulation multilayer 200 using an adhesive, may be prevented.

As used herein, the term of "directly integrating" refers to parts of a component that are formed on the base according to a predetermined process sequence and the component is completed on the base. For example, "directly integrating" is different from attaching a component onto a base after the manufacture of the component is completed. Before the touch panel 300 is directly integrated on the flexible encapsulation multilayer 200, an inorganic insulating film may be integrated on the flexible encapsulation multilayer 200. The inorganic insulating film may include silicon nitride or silicon oxynitride including silicon and nitrogen. The inorganic insulating film may reduce damage to the flexible encapsulation multilayer 200 when the touch panel 300 is directly integrated on the flexible encapsulation multilayer 200.

Since the touch panel 300 is directly integrated on the flexible encapsulation multilayer 200, the direction in which the touch external circuit board 330 is attached to the touch terminals 303 in the touch terminal area 321 may be substantially the same as the direction in which the display external circuit board 340 is attached to the display terminals 156 in the display terminal area 157.

Referring to FIG. 1, both the display terminal area 157, in which the display terminals 156 are disposed, and the touch terminal area 321, in which the touch terminals 303 are disposed, are disposed in the fourth peripheral area PA4. If the touch terminal area 321 is disposed in the first peripheral area PA1 by widening the first peripheral area PA1, such that the display area DA is located at the center of the lower structure 100, the second peripheral area PA2 should also be widened at the same time, which may narrow the display area DA. Therefore, according to the exemplary embodiments, both the display terminal area 157 and the touch terminal area 321 are disposed in the fourth peripheral area PA4, as shown in FIG. 2.

Referring to FIG. 2, both the display terminal area 157, in which the display terminals 156 are disposed, and a touch terminal area 321_a, in which touch terminals 303_a are disposed, are disposed in the fourth peripheral area PA4. Further, both the display terminal area 157 and the touch terminal area 321_a may be adjacent to the outside of the lower structure 100 in the fourth direction y2. That is, the display terminal area 157 and the touch terminal area 321_a are disposed adjacent to each other along the first direction x1 or the second direction x2. In this case, since the area of the fourth peripheral area PA4 may be relatively narrower than the fourth peripheral area PA4 shown in FIG. 1, the display area DA may be made wider.

Further, the touch terminal areas 321 and 321_a are disposed in the flat area FA defined on the second inorganic layer 213. When the touch terminal areas 321 and 321_a are formed in an area other than the flat area FA, adhesive force between the touch terminals 303 and 303_a and the touch external circuit boards 330 and 330_a is significantly decreased and may cause a detachment problem. However, according to the exemplary embodiments, detachment may be avoided by forming the touch terminal areas 321 and 321_a in the flat rea FA.

The display terminals 156 have a greater size than the touch terminals 303 and 303_a. The display terminals 156 include a power supply terminal, and the like. When the electroluminescent unit EU is current-driven, a relatively large amount of power should be stably supplied. On the other hand, when touch sensing detects a voltage change, the relatively large power may not be required. Accordingly, the display terminals 156 may have a greater size than the touch terminals 303 and 303_a. Further, when the area of the touch terminals 303 and 303_a is widened, excessive heat may be applied during the process of attaching the touch external circuit boards 330 and 330_a, which may cause thermal damage to the organic layer 212 included in the flexible encapsulation multilayer 200. Thus, it is advantageous to form the areas of the touch terminals 303 and 303_a with relatively small sizes.

The touch wires 302 may extend to overlap the auxiliary upper electrode 172 in the cross-sectional view of FIG. 3 and may extend to intersect the auxiliary upper electrode 172 in a plan view of FIGS. 1 to 3. By forming the auxiliary upper electrode 172 and the touch wires 302 to overlap with each other, the area of the first to fourth peripheral areas PA1, PA2, PA3, and PA4 may be minimized. Further, the peripheral circuit C2 is disposed under the auxiliary upper electrode 172 (e.g., overlap the auxiliary upper electrode 172 in the cross-sectional view of FIG. 3). By overlapping the touch wires 302 with the auxiliary upper electrode 172, a signal influence between the touch wires 302 and the peripheral circuit C2 may be minimized.

Referring to FIG. 2, the flat area FA defined on the second inorganic layer 213 of the flexible encapsulation multilayer 200 may have a protruding portion P which is a portion protruding in a direction substantially parallel to a direction from the display area DA toward the display terminal area 157. The touch terminal area 321_a, in which the touch terminals 303_a are disposed, is disposed on the protruding portion P, so that both the display terminal area 157 and the touch terminal area 321_a may be disposed adjacent to the outside of the lower structure 100 in the fourth direction y2. In this case, the area of the fourth peripheral area PA4 may be reduced by forming the display terminal area 157 and the touch terminal area 321_a adjacent to each other in the first direction x1 or the second direction x2 while locating both the display terminal area 157 and the touch terminal area 321_a in the fourth peripheral area PA4. As a result, the area of the display area DA may be maximized.

Although the touch terminal areas 321 and 321_a, in which the touch terminals 303 and 303_a are disposed, are illustrated as being disposed on the flat area FA in FIGS. 1 to 3, the inventive concepts are not limited thereto. More particularly, the touch terminal area 321 may be disposed on an area other than the flat area FA, which will be described in more detail with reference to FIGS. 5 to 10.

Figure 5:
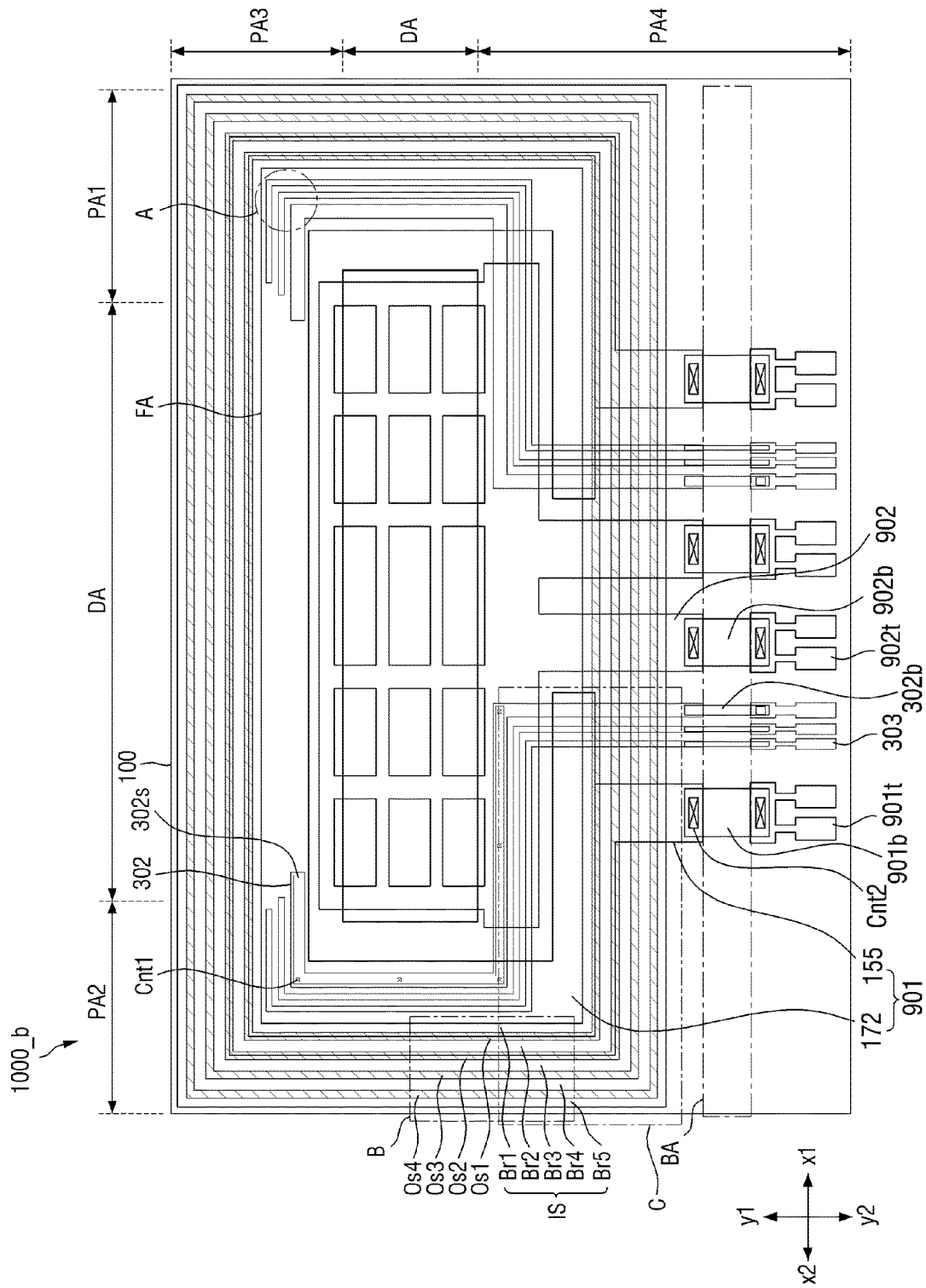
FIG. 5 is a schematic view showing an exemplary embodiment of a display device constructed according to the principles of the invention.

FIG. 5 is a schematic view showing a display device according to yet another embodiment of the present disclosure.

Referring to FIG. 5, a display device 1000_b includes the upper electrode power supply wire 901 electrically connected to the upper electrode 191 of the electroluminescent unit EU to apply an electrical signal to the upper electrode 191 and a lower electrode power supply wire 902 electrically connected to the lower electrode 171 of the electroluminescent unit EU to apply an electrical signal to the lower electrode 171. Here, the upper electrode power supply wire 901 may include the bus wire 155 and the auxiliary upper electrode 172.

Figure 6:
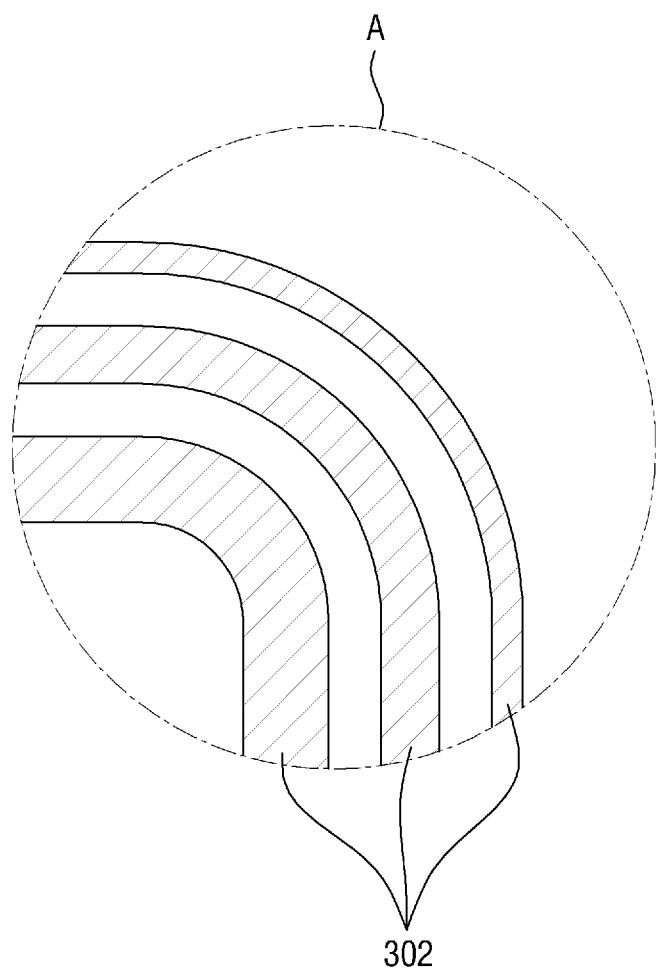
FIG. 6 is an enlarged view of portion "A" of FIG. 5.

FIG. 6 is an enlarged view of portion "A" of FIG. 5.

Referring to FIG. 6, the touch wires 302 may be curved without angled portions at the corners of the lower structure 100. That is, the touch wire 302 may extend to form a curvature at the corner of the lower structure 100. Accordingly, electric field concentration that may occur with respect to the touch wire 302 at the corner may be prevented.

The plurality of touch wires 302 extend on the first to fourth peripheral areas PA1, PA2, PA3, and PA4. The touch wires 302 are electrically connected to auxiliary touch wires 302s through a plurality of first contacts Cnt1. The touch wires 302 and the auxiliary touch wires 302s may be connected to each other to reduce the overall resistance. Also, even when the touch wires 302 are damaged or cut from repeatedly bending and restoring the display device 1000_b, a normal electrical signal may be transmitted through the auxiliary touch wires 302s. The auxiliary touch wires 302s and the touch wires 302 may be formed on the flat area FA on the second inorganic layer 213. In this case, damage to the touch wires 302 and the auxiliary touch wires 302s may be minimized, as compared to when they are formed on the non-flat area.

The touch wires 302 may be formed to overlap the upper electrode power supply wire 901. Therefore, it is possible to prevent the peripheral circuit C2 disposed below the upper electrode power supply wire 901 from being interfered by an electrical signal transmitted through the touch wires 302.

The widths of each of the touch wires 302 disposed in the first to fourth peripheral areas PA1, PA2, PA3, and PA4 may be decreased, as they are disposed farther away from the display area DA and may be increased, as they are disposed closer to the display area DA. As shown in FIG. 5, the length of the outermost touch wire 302 is relatively longer than that of the innermost touch wire 302. When the width of the outermost touch wire 302 is equal to that of the innermost touch wire 302, the area of the outermost touch wire 302 may become wider. Therefore, the capacitance generated with the overlapping upper electrode power supply wire 901 may also be greater in the outermost touch wire 302, which may cause a capacitance difference between the touch wires 302. Therefore, in order to reduce such capacitance difference, the width of the touch wire 302 disposed farther away from the display area DA may be less and the width of the touch wire 302 disposed closer to the display area DA may be greater, as shown in FIG. 6.

Further, the touch wires 302 may be disposed to overlap the lower electrode power supply wire 902. Since a signal of the upper electrode 191 may affect the touch wires 302 when the touch wires 302 are disposed to overlap only the upper electrode power supply wire 901, the touch wires 302 may be disposed to overlap the lower electrode power supply wire 902 as well as the upper electrode power supply wire 901 to minimize an excessive signal influence by the upper electrode power supply wire 901.

An upper electrode power supply terminal 901t, a lower electrode power supply terminal 902t, and the touch terminals 303 are respectively disposed at the end of the upper electrode power supply wire 901, the end of the lower electrode power supply wire 902, and the ends of the touch wires 302. Here, each of the upper electrode power supply terminal 901t and the lower electrode power supply terminal 902t may be one type of the display terminals 156 described above (see FIGS. 1 and 2). When the electroluminescent unit EU is current-driven, the upper electrode power supply terminal 901t and the lower electrode power supply terminal 902t should stably supply a relatively large power, as compared to the power supplied to the touch terminals 303. On the other hand, when touch sensing detects a voltage change, applying a large power to the touch terminals 303 may not be required. As such, the size of the upper electrode power supply terminal 901t and the lower electrode power supply terminal 902t may be formed to be relatively greater than the size of the touch terminals 303. That is, the size of the touch terminals 303 may be formed to be relatively less than the size of the upper electrode power supply terminal 901t and the lower electrode power supply terminal 902t.

Further, as shown in FIG. 5, by placing the touch terminals 303 between the lower electrode power supply terminal 902t and the upper electrode power supply terminal 901t, signal interference that may occur between the lower electrode power supply terminal 902t and the upper electrode power terminal 901t that are disposed close to each other may be prevented. That is, the upper electrode power supply terminal 901t, the touch terminals 303, the lower electrode power supply terminal 902t are sequentially disposed along the first direction x1 or the second direction x2, thereby minimizing signal interference between these components. Of course, if necessary, terminals for transmitting other types of signals may be additionally disposed between the touch terminals 303 and the lower electrode power supply terminal 902t or between the touch terminals 303 and the upper electrode power supply terminal 901t.

The upper electrode power supply terminal 901t, the touch terminals 303, and the lower electrode power supply terminal 902t may be disposed in one direction (e.g., the first direction x1). Further, the lower electrode power supply terminal 902t, the touch terminals 303, and the upper electrode power supply terminal 901t may be in contact with and electrically connected to one external circuit board (not shown), such as a flexible printed circuit board.

The first to fourth peripheral areas PA1, PA2, PA3, and PA4 may have a bendable area BA disposed between the display area DA and at least one of the lower electrode power supply terminal 902t, the upper electrode power supply terminal 901t, and the touch terminals 303.

In order to easily bend the bendable area BA, the touch wires 302 may not be disposed to overlap or intersect the upper electrode power supply wire 901 and the lower electrode power supply wire 902 within the bendable area BA. Further, the auxiliary touch wires 302s may not be formed in the bendable area BA.

By bending the bendable area BA, the external circuit board connected to the at least one of the lower electrode power supply terminal 902t, the upper electrode power supply terminal 901t, and the touch terminals 303 may be fixed to the back surface of the display device 1000_b.

The lower electrode power supply wire 902, the upper electrode power supply wire 901, and the touch wires 302 may include a conductive bridge 902b, a conductive bridge 901b, and a conductive bridge 302b, respectively. The conductive bridges 902b, 901b, and 302b may have contacts Cnt2 and pass through the bendable area BA. The conductive bridges 902b, 901b, and 302b may be formed in a different layer from the touch wires 302, the upper electrode power supply wire 901, and the lower electrode power supply wire 902 adjacent to the conductive bridges 902b, 901b, and 302b. The conductive bridges 902b, 901b, and 302b may assist the bendable area BA bend more easily.

Although not illustrated in the figures, by making the sum of the thicknesses of the insulating layers in the bendable area BA relatively less than the sum of the thicknesses of the insulating layers in portions of the first to fourth peripheral areas PA1, PA2, PA3, and PA4 adjacent to the bendable area BA, the bendable area BA may be bent more easily.

Figure 7:
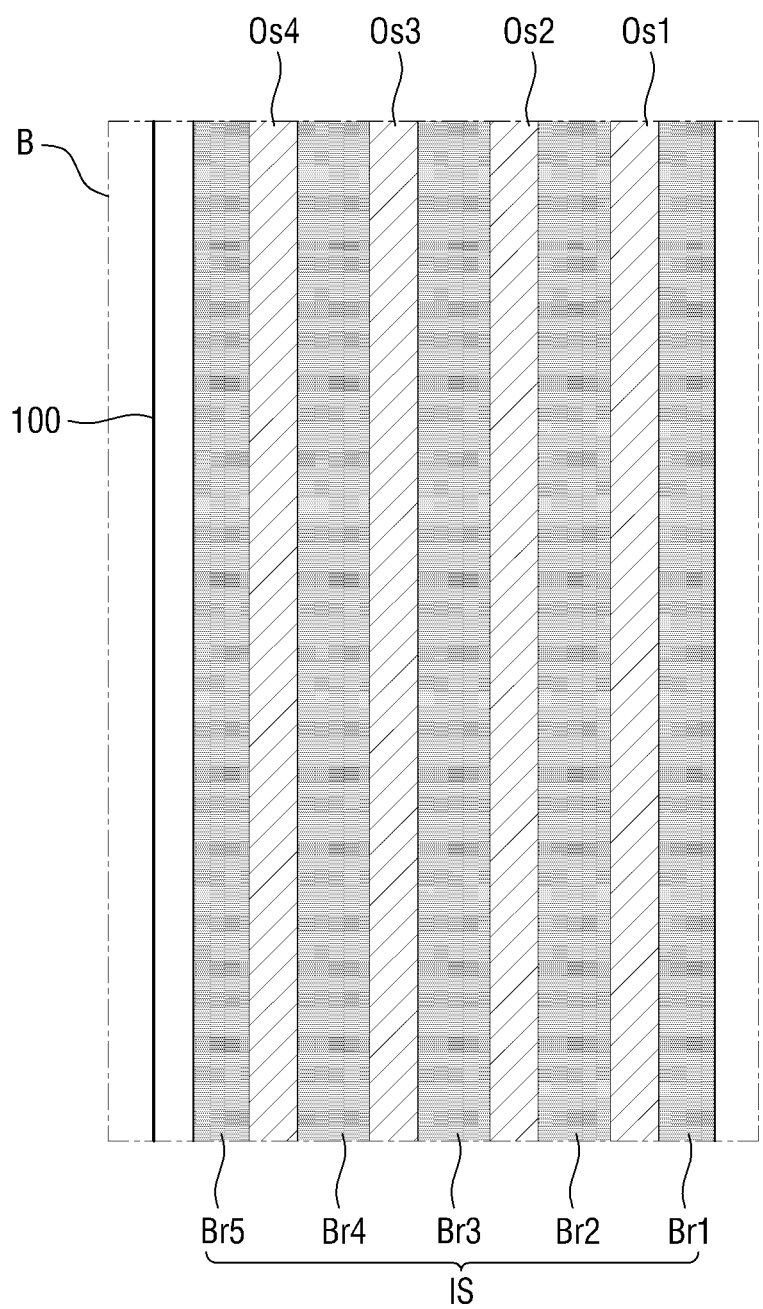
FIG. 7 is an enlarged view of area "B" of FIG. 5.

The first to fourth peripheral areas PA1, PA2, PA3, and PA4 have the inorganic surface portion IS having a closed shape contiguously surrounding the display area DA. FIG. 7 is an enlarged view of area "B" of FIG. 5. Referring to FIG. 7, the inorganic surface portion IS has a region divided into first to fifth inorganic surface branches Br1, Br2, Br3, Br4, and Br5, which are spaced apart from each other. The first to fourth peripheral areas PA1, PA2, PA3, and PA4 may include first to fourth organic surface portions Os1, Os2, Os3, and Os4 disposed between the first to fifth inorganic surface branches Br1, Br2, Br3, Br4, and Br5. Specifically, the first to fourth peripheral areas PA1, PA2, PA3, and PA4 include the first organic surface portion Os1 disposed between the first and second inorganic surface branches Br1 and Br2, the second organic surface portion Os2 disposed between the second and third inorganic surface branches Br2 and Br3, the third organic surface portion Os3 disposed between the third and fourth inorganic surface branches Br3 and Br4, and the fourth organic surface portion Os4 disposed between the fourth and fifth inorganic surface branches Br4 and Br5.

Since the structure of the first to fourth organic surface portions Os1, Os2, Os3, and Os4 is similar to that of the organic surface portion Os (see FIG. 4), a description thereof will be omitted to avoid redundancy.

The first to fourth organic surface portions Os1, Os2, Os3, and Os4 are completely surrounded by the inorganic-inorganic direct bonding between the lower surface of the flexible encapsulation multilayer 200 and the inorganic surface portion IS in a plan view. The first to fourth organic surface portions Os1, Os2, Os3, and Os4 absorb and hold impurities moving along an interface between the lower surface of the flexible encapsulation multilayer 200 and the inorganic surface portion IS in a plan view, thereby reducing the concentration of impurities existing at the interface between the lower surface of the flexible encapsulation multilayer 200 and the inorganic surface portion IS. Therefore, the bonding force of the inorganic-inorganic direct bonding may be increased.

When the impurities disposed at the interface formed by the inorganic-inorganic direct bonding between the lower surface of the flexible encapsulation multilayer 200 and the inorganic surface portion IS are relatively far away from the first to fourth organic surface portions Os1, Os2, Os3, and Os4, the impurities may be concentrated on a portion of the interface between the lower surface of the flexible encapsulation multilayer 200 and the inorganic surface portion IS before moving to the first to fourth organic surface portions Os1, Os2, Os3, and Os4 to decrease the bonding force of the inorganic-inorganic direct bonding. In addition, the impurities may move to the display area DA before moving to the first to fourth organic surface portions Os1, Os2, Os3, and Os4 to deteriorate an intermediate layer included in the electroluminescent unit EU of the display area DA.

The concentration of the impurities at a portion of the interface or the movement of the impurities to the display area DA may occur more frequently when the display area DA has a flexible portion that is subjected to repeated bending (or folding) and restoring actions. In this case, the first to fourth organic surface portions Os1, Os2, Os3, and Os4 may reduce the concentration of the impurities. As used herein, a flexible portion of the display area may refer to that the display device may be used as a bendable display device, a foldable display device, a rollable display device, a stretchable display device, or a flexible display device. Furthermore, even when the display area DA does not have the flexible portion, in a rigid display device employing the flexible encapsulation multilayer 200, the impurities may be concentrated at a certain portion of the interface or the movement of the impurities to the display area DA may occur. Even in this case, the organic surface portions Os1, Os2, Os3, and Os4 may reduce the concentration of the impurities. That is, the exemplary embodiments are applicable to a flat rigid display device in which the flexible encapsulation multilayer 200 is fixed to a flat and rigid window and a curved rigid display device in which the flexible encapsulation multilayer 200 is fixed to a curved and rigid window.

Therefore, in order to make the impurities disposed at the interface formed by the inorganic-inorganic direct bonding closer to the first to fourth organic surface portions Os1, Os2, Os3, and Os4, the first to fourth organic surface portions Os1, Os2, Os3, and Os4 may have a shape surrounding or substantially surrounding the display area DA. As used herein, the term of "surrounding" or "substantially surrounding" refers to contiguously surrounding or discontiguously surrounding.

Figure 9:
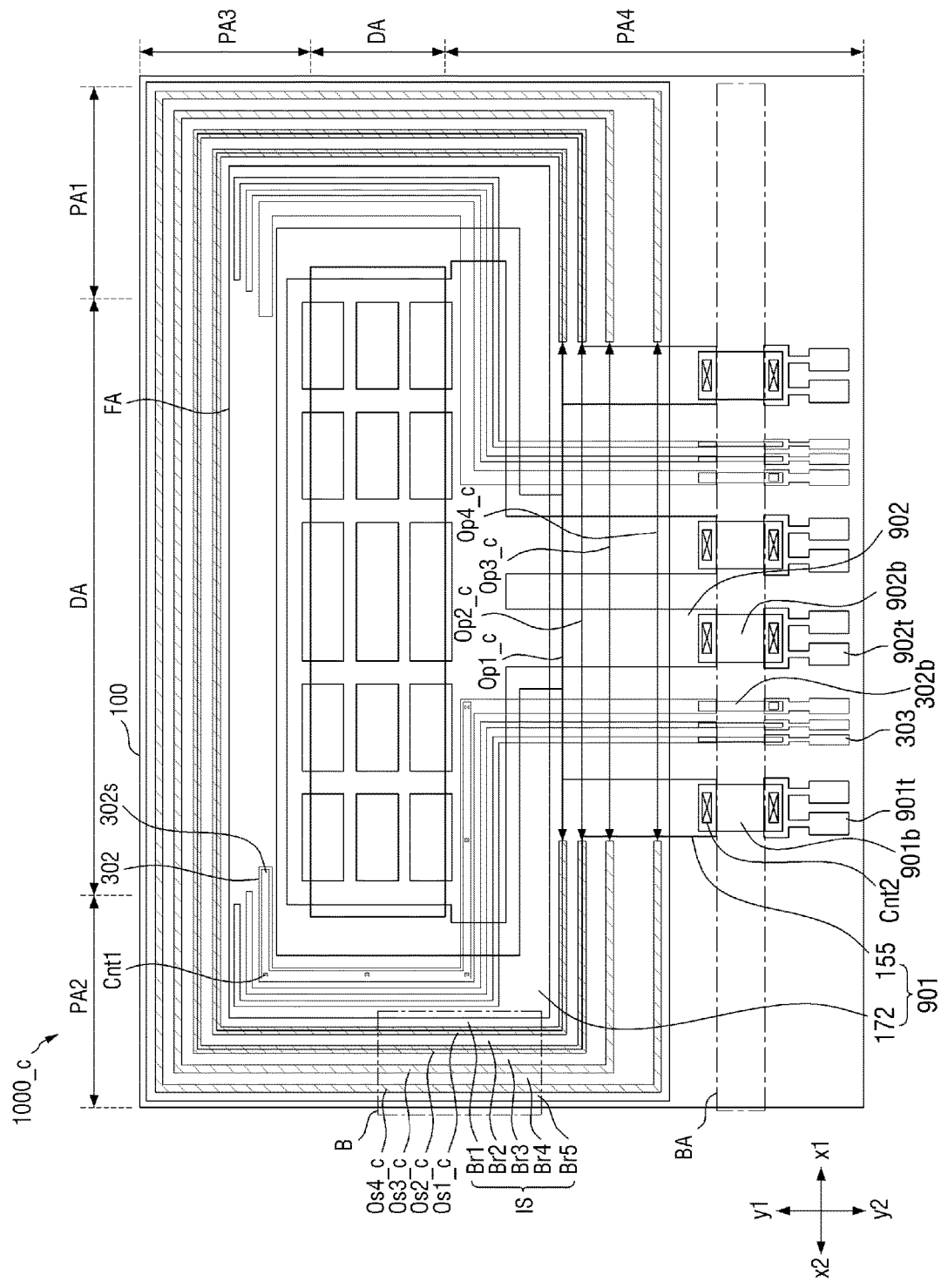
FIG. 9 is a schematic view showing an exemplary embodiment of a display device constructed according to the principles of the invention.
Figure 11:
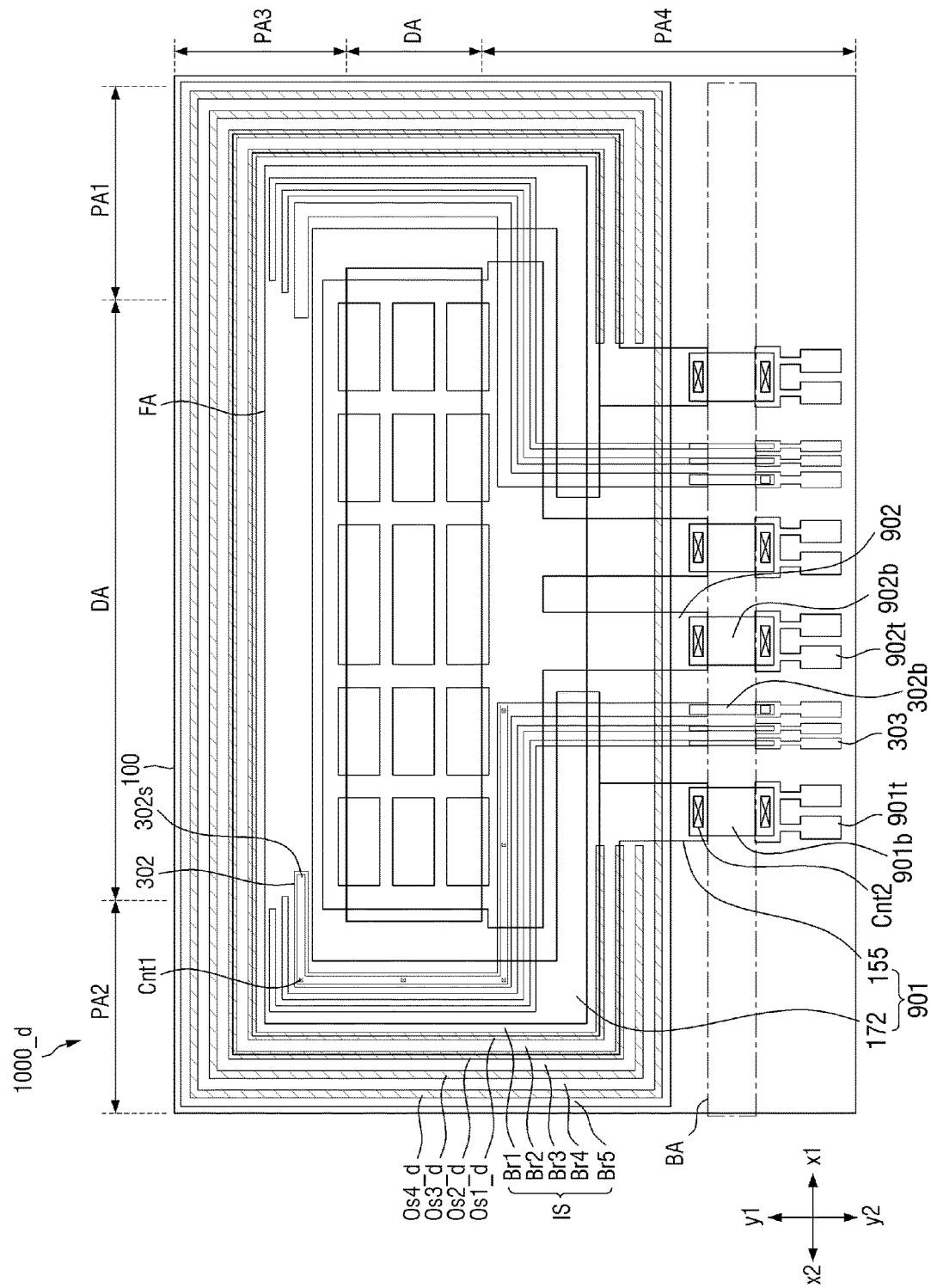
FIG. 11 is a schematic view showing an exemplary embodiment of a display device constructed according to the principles of the invention.
Figure 12:
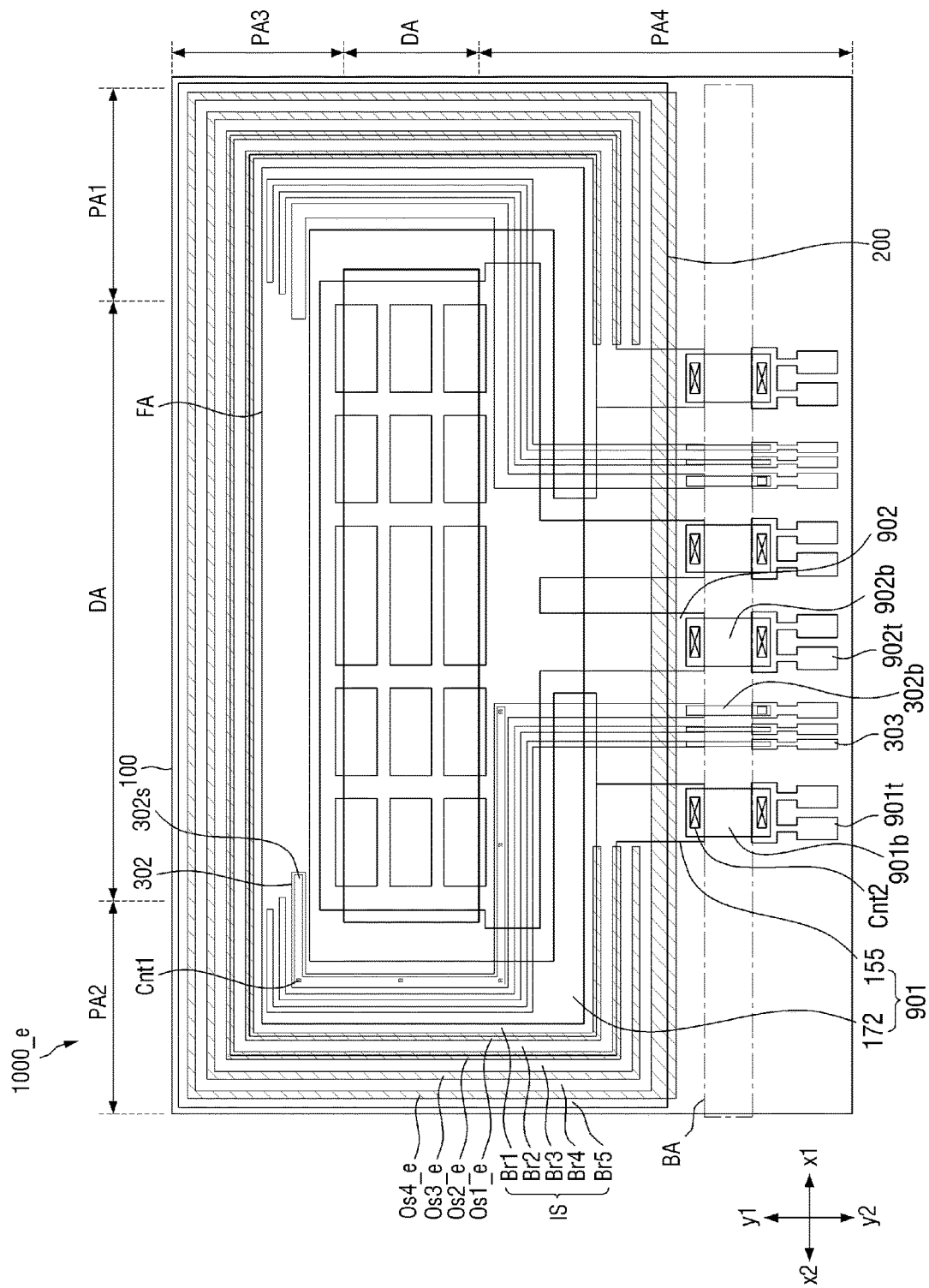
FIG. 12 is a schematic view showing an exemplary embodiment of a display device constructed according to the principles of the invention.

Specifically, referring to FIG. 5, the first to fourth organic surface portions Os1, Os2, Os3, and Os4 contiguously surround the display area DA. Referring to FIG. 9, first to fourth organic surface portions Os1_c, Os2_c, Os3_c, and Os4_c discontiguously surround the display area DA. Referring to FIG. 11, first to third organic surface portions Os1_d, Os2_d, and Os3_d discontiguously surround the display area DA and a fourth organic surface portion Os4_d contiguously surrounds the display area DA, so that the first to fourth organic surface portions Os1_d, Os2_d, Os3_d, and Os4_d surround or substantially surround the display area DA. Referring to FIG. 12, first to third organic surface portions Os1_e, Os2_e, and Os3_e discontiguously surround the display area DA and a fourth organic surface portion Os4_e contiguously surrounds the display area DA, so that the first to fourth organic surface portions Os1_e, Os2_e, Os3_e, and Os4_e surround or substantially surround the display area DA.

If the display area DA has two or less outer sides (e.g., a circle, an ellipse, or a semicircle), the first to fourth organic surface portions Os1, Os2, Os3, and Os4 may contiguously or discontiguously surround the display area DA, such that the organic surface portions Os1, Os2, Os3, and Os4 extend contiguously or discontiguously to correspond to at least one quarter of the entire outer periphery of the display area DA. If the display area DA has a triangular shape, organic surface portions may contiguously or discontiguously surround the display area DA, such that the organic surface portions extend contiguously or discontiguously to correspond to at least one outer side of the display area DA. Further, if the display area DA has a shape, such as square, pentagon, and hexagon, organic surface portions may contiguously or discontiguously surround the display area DA, such that that the organic surface portions (not shown) extend contiguously or discontiguously to correspond to at least two outer sides of the display area DA.

Referring to back FIG. 5, since the first to fourth organic surface portions Os1, Os2, Os3, and Os4 are completely surrounded by the inorganic-inorganic direct bonding in a plan view, the first to fourth organic surface portions Os1, Os2, Os3, and Os4 are isolated from (or do not communicate with) the outside of the display device 1000_b. Therefore, moisture and impurities from the outside of the display device 1000_b may be prevented from infiltrating to the interface formed by the inorganic-inorganic direct bonding between the inorganic surface portion IS and the lower surface of the flexible encapsulation multilayer 200, through the first to fourth organic surface portions Os1, Os2, Os3, and Os4.

The first organic surface portion Os1, the second organic surface portion Os2, the third organic surface portion Os3, or the fourth organic surface portion Os4 may have a shape that protrudes upward in a cross-sectional view. Further, in a plan view, the first organic surface portion Os1, the second organic surface portion Os2, the third organic surface portion Os3, or the fourth organic surface portion Os4 may have various shapes, such as an island shape, and a shape extending along the extending direction of the first to fifth inorganic surface branches Br1, Br2, Br3, Br4, and Br5.

The height of the first organic surface portion Os1, the second organic surface portion Os2, the third organic surface portion Os3, or the fourth organic surface portion Os4 may be substantially the same as the height of the pixel defining layer 181. Although not illustrated in the figures, the height of the pixel defining layer 181 may include the height of a spacer protruding upward from the top of the pixel defining layer 181.

As one example, the height of the first organic surface portion Os1 may be substantially equal to the height of the pixel defining layer 181. In this case, the first organic surface portion Os1 may be used as a spacer, which contacts an evaporation mask during a vacuum evaporation process for forming an intermediate layer of the electroluminescent unit EU. Specifically, when a hole injection layer (HIL), a hole transport layer (HTL), an electron injection layer (EIL), an electron transport layer (ETL), and the like included in the intermediate layer are formed as a common layer, the first organic surface portion Os1 having substantially the same as the height of the pixel defining layer 181 may be used as a spacer of an open evaporation mask. Further, since the first organic surface portion Os1 has a substantially closed loop shape that contiguously surrounds the display area DA, the entire edge of the evaporation mask may correspond to the entire first organic surface portion Os1. Therefore, during the evaporation process, the organic materials passing through the evaporation mask may be prevented from escaping to the outside from an internal space defined by the evaporation area of the lower structure 100, the first organic surface portion Os1, and the evaporation mask. Further, the first organic surface portion Os1 may also be used as a spacer for forming the upper electrode 191 when the upper electrode 191 is formed by a vacuum evaporation process and has a common film structure.

In the first to fourth peripheral areas PA1, PA2, PA3, and PA4, a portion of the flexible encapsulation multilayer 200 including the organic layer 212 has a relatively greater height and a portion of the flexible encapsulation multilayer 200 not including the organic layer 212 has a relatively less height. As such, a height difference occurs between the portions of the flexible encapsulation multilayer 200. The height difference may deteriorate the thickness uniformity of the touch wires 302 when the touch wires 302 are formed and may cause breakage of the touch wires 302. Therefore, according to exemplary embodiments, the first organic surface portion Os1, the second organic surface portion Os2, the third organic surface portion Os3, or the fourth organic surface portion Os4 may be formed to have a shape protruding in a direction perpendicular to the plane on which the substrate 101 is disposed and the protruding shape may be disposed adjacent to the edge of the organic layer 212 or the outer periphery of the organic layer 212 included in the flexible encapsulation multilayer 200 in the first to fourth peripheral areas PA1, PA2, PA3, and PA4. As such, the height difference between the portions of the flexible encapsulation multilayer 200 may be reduced. Thus, the non-uniformity in the thickness of the touch wires 302 and the breakage of the touch wires 302 may be reduced. A further explanation will be given with reference to FIG. 8.

Figure 8:
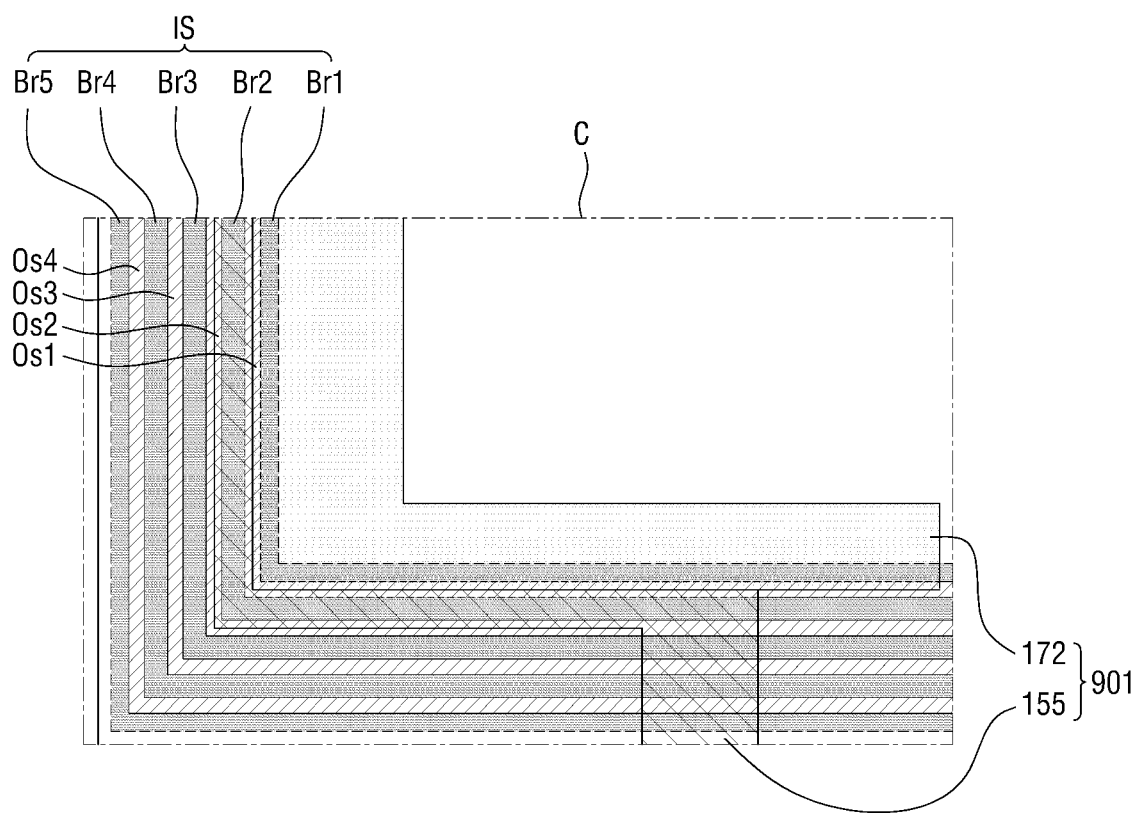
FIG. 8 is an enlarged view of area "C" of FIG. 5.

FIG. 8 is an enlarged view of area "C" of FIG. 5.

Referring to FIG. 8, the innermost first organic surface portion Os1 may be disposed to cover a boundary where the bus wire 155 and the auxiliary upper electrode 172 overlap each other. Thus, defects that may occur due to a step generated between the bus wire 155 and the auxiliary upper electrode 172 may be minimized by the first organic surface portion Os1 disposed at the innermost side. Further, the second organic surface portion Os2 disposed second from the innermost side may be disposed to cover the outer edge of the bus wire 155. Thus, defects due to a step formed in the outer edge of the bus wire 155 may be minimized by the second organic surface portion Os2 disposed second from the innermost side.

FIG. 9 is a schematic view showing an exemplary embodiment of a display device constructed according to the principles of the invention.

As shown in FIG. 9, the first organic surface portion Os1_c may have a substantially open loop shape which is opened by at least one first opening Op1_c to discontiguously surround the display area DA. The second organic surface portion Os2_c may have a substantially open loop shape which is opened by at least one second opening Op2_c to discontiguously surround the display area DA. The third organic surface portion Os3_c may have a substantially open loop shape which is opened by at least one third opening Op3_c to discontiguously surround the display area DA. The fourth organic surface portion Os4_c may have a substantially open loop shape which is opened by at least one fourth opening Op4_c to discontiguously surround the display area DA.

When the first to fifth inorganic surface branches Br1, Br2, Br3, Br4, and Br5 included in the inorganic surface portion IS are not connected to each other, the lower surface of the flexible encapsulation multilayer 200 may be detached from at least one of the first to fifth inorganic surface branches Br1, Br2, Br3, Br4, and Br5 when excessive physical stress is applied to a display device 1000_c. However, according to exemplary embodiments, since the inorganic surface branches Br1, Br2, Br3, Br4, and Br5 are connected to each other by the first to fourth openings Op1_c, Op2_c, Op3_c, and Op4_c, the above-described problem may be solved.

Figure 10:
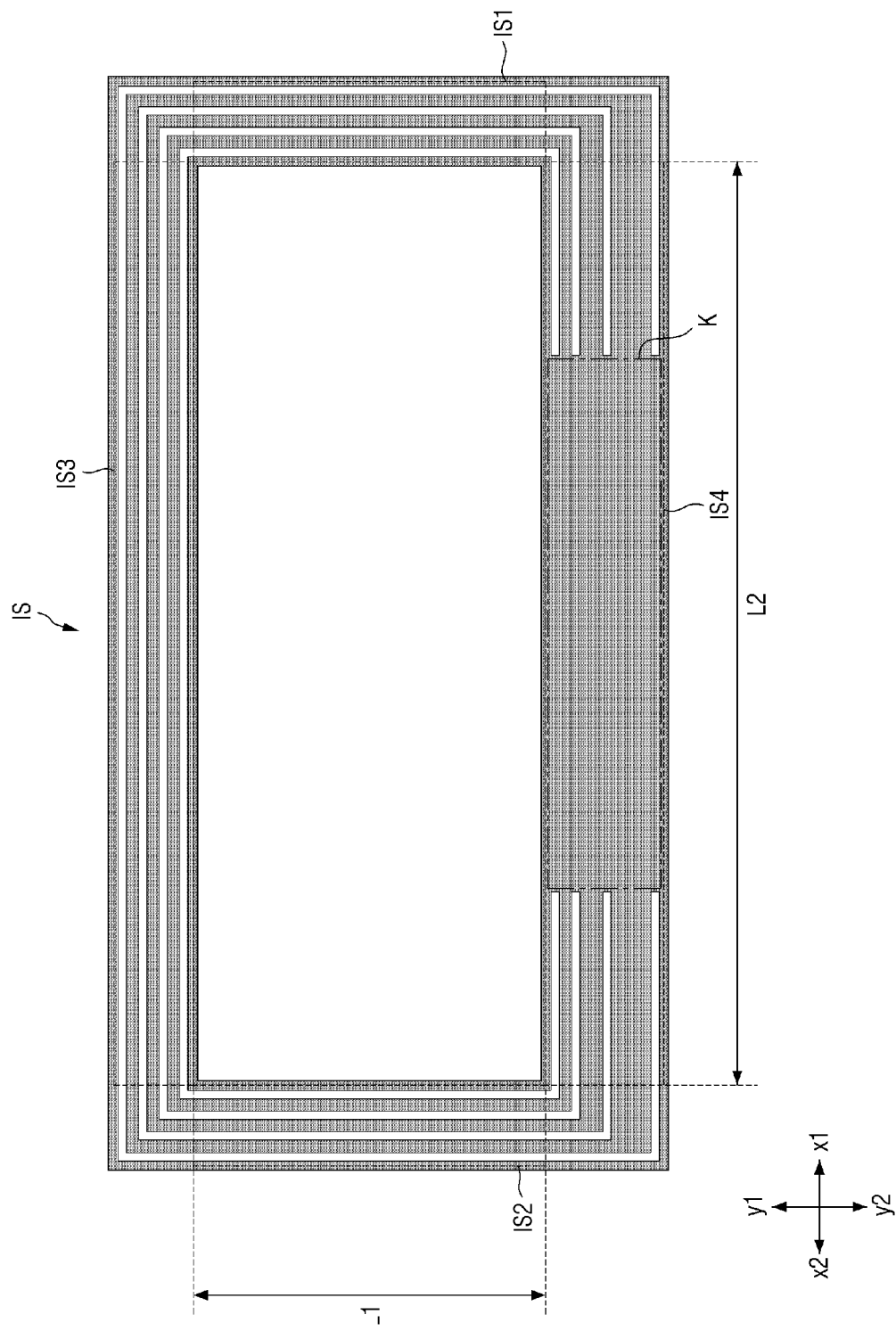
FIG. 10 is a schematic view illustrating an inorganic surface portion of FIG. 9.

FIG. 10 is a schematic view illustrating the inorganic surface portion IS shown in FIG. 9. Referring to FIG. 10, the inorganic surface portion IS includes a first region IS1 disposed along the first direction x1, a second region IS2 disposed along the second direction x2, a third region IS3 disposed along the third direction y1, and a fourth region IS4 disposed along the fourth direction y2 with respect to the display are DA.

Referring to FIGS. 9 and 10, since the first to fourth organic surface portions Os1_c, Os2_c, Os3_c, and Os4_c have a substantially open loop shape, the surface of area "K" of the inorganic surface portion IS corresponding to the first to fourth openings Op1_c, Op2_c, Op3_c, and Op4_c does not have organic materials capable of absorbing and removing impurities. Thus, the impurities disposed at the interface formed by the inorganic-inorganic direct bonding may be concentrated on a portion of the interface between the lower surface of the flexible encapsulation multilayer 200 and the inorganic surface portion IS, which may weaken the bonding force of the inorganic-inorganic direct bonding. Accordingly, the bonding force of the inorganic-inorganic direct bonding in area "K" may be lowered as compared with other portions having no first to fourth openings Op1_c, Op2_c, Op3_c, and Op4_c. Therefore, the width of the fourth region IS4 of the inorganic surface portion IS where area "K" is disposed is formed relatively greater than the width of the first region IS1, the second region IS2, or the third region IS3 of the inorganic surface portion IS where area "K" is not disposed.

As used herein, the width may refer to an average width. More specifically, referring to FIG. 9, the width of the first region IS1 may be a value obtained by dividing the area of the first region IS1 in a plan view by a first length L1. The width of the second region IS2 is a value obtained by dividing the area of the second region IS2 in a plan view by the first length L1. The width of the third region IS3 is a value obtained by dividing the area of the third region IS3 in a plan view by a second length L2. The width of the fourth region IS4 is a value obtained by dividing the area of the fourth region IS4 in a plan view by the second length L2.

FIG. 11 is a schematic view showing an exemplary embodiment of a display device constructed according to the principles of the invention.

Referring to FIG. 11, the lower structure 100 of a display device 1000_d includes the first to third organic surface portions Os1_d, Os2_d, and Os3_d having a shape forming a substantially open loop and the fourth organic surface portion Os4_d having a shape forming a substantially closed loop. That is, the lower structure 100 may include both the first to third organic surface portions Os1_d, Os2_d, and Os3_d having a substantially open loop shape and the fourth organic surface portion Os4_d having a substantially closed loop shape.

FIG. 12 is a schematic view showing an exemplary embodiment of a display device constructed according to the principles of the invention.

Referring to FIG. 12, while the first to third organic surface portions Os1_e, Os2_e, and Os3_e included in the lower structure 100 of a display device 1000_e are completely surrounded by the direct bonding between the lower surface of the flexible encapsulation multilayer 200 and the inorganic surface portion IS in a plan view, the fourth organic surface portion Os4_e may be disposed to be only partially surrounded by the inorganic-inorganic direct bonding in a plan view. That is, the fourth organic surface portion Os4_e may communicate with the outside of the display device 1000_e.

That is, the lower structure 100 according to the illustrated embodiment may include the fourth organic surface portion Os4_e having a substantially closed loop shape communicating with the outside and the first to third organic surface portions Os1_e, Os2_e, and Os3_e which are disposed between the display area DA and the fourth organic surface portion Os4_e. Here, the first to third organic surface portions Os1_e, Os2_e, and Os3_e have substantially open loop shapes and completely surrounded by the direct bonding between the lower surface of the flexible encapsulation multilayer 200 and the inorganic surface portion IS in a plan view.

In this case, the height of the fourth organic surface portion Os4_e communicating with the outside may be substantially the same as that of the pixel defining layer 181 and may function as a spacer for the evaporation mask. By making the height of the first to third organic surface portions Os1_e, Os2_e, and Os3_e, which do not communicate with the outside, relatively lower than the height of the fourth organic surface portion Os4_e communicating with the outside, the width of the first to third organic surface portions Os1_e, Os2_e, and Os3_e, which do not communicate with the outside, is effectively lowered to narrow the width of the first to fourth peripheral areas PA1, PA2, PA3, and PA4.

Meanwhile, the first and second organic surface portions Os1_e and Os2_e may extend to cover a side portion of a conductive multilayer. Since the side portion of the conductive multilayer is vulnerable to corrosion because a large number of interfaces are exposed, the first and second organic surface portions Os1_e and Os2_e may prevent the corrosion of the conductive multilayer by covering the side portion of the conductive multilayer. Further, the first and second organic surface portions Os1_e and Os2_e may absorb and hold impurities, such as moisture and oxygen, which may flow out from the interfaces exposed at the side portion of the conductive multilayer.

For example, the conductive multilayer is the auxiliary upper electrode 172 which is the same film as the lower electrode 171 of the electroluminescent unit EU and a side portion of the auxiliary upper electrode 172 may be covered by the first organic surface portion Os1_e disposed at the innermost side in FIG. 12. In this case, the auxiliary upper electrode 172 may include a first conductive indium tin oxide film, a silver (Ag) film on the first conductive indium tin oxide film, and a second conductive indium tin oxide film on the silver film.

For example, the conductive multilayer may be the bus wire 155 which is the same film as the source electrode 156a or the drain electrode 156b of the pixel thin film transistor (PC-TFT) and the side portion of the bus wire 155 may be covered by the second organic surface portion Os2_e disposed second from the innermost side in FIG. 12. The bus wire 155 may be the same film as the source electrode 156a or the drain electrode 156b of the pixel thin film transistor (PC-TFT). In this case, the bus wire 155 may include a first titanium (Ti) film, an aluminum (Al) film on the first titanium film, and a second titanium film on the aluminum film or may include a first molybdenum (Mo) film, an aluminum film on the first molybdenum film, and a second molybdenum film on the aluminum film.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An electroluminescent device, comprising:
a lower structure which has an emission area and a peripheral area completely surrounding the emission area, and which comprises an insulation film and an electroluminescent unit having a lower electrode located on the insulation film, an intermediate film located on the lower electrode, and an upper electrode located on the intermediate film;
a flexible encapsulation multilayer located on the emission area and the peripheral area of the lower structure, and including at least three layers; and
a touch panel located on the flexible encapsulation multilayer, and having a touch electrode,
wherein:
the peripheral area includes a lower electrode power supply terminal, a lower electrode power supply wire electrically connecting the lower electrode to the lower electrode power supply terminal, an upper electrode power supply terminal, an upper electrode power supply wire electrically connecting the upper electrode to the upper electrode power supply terminal, a touch terminal, and a touch wire electrically connecting the touch electrode to the touch terminal;
the flexible encapsulation multilayer includes a lower surface comprising only one or more inorganic materials;
the peripheral area includes an inorganic surface portion comprising only one or more inorganic materials, located outside the upper electrode in a plan view, and having a first inorganic surface branch completely surrounding the emission area in a plan view;
an entire of the inorganic surface portion directly contacts the lower surface of the flexible encapsulation multilayer;
the lower structure includes a lower encapsulating inorganic film horizontally expanding to vertically correspond to the emission area and the peripheral area and located substantially not higher than an upper surface of the lower structure;
a portion located between a lower surface of the lower encapsulating inorganic film and the entire of the inorganic surface portion does not comprise an organic material; and
the touch wire comprises a first portion overlapping the lower electrode power supply wire and a second portion overlapping the upper electrode power supply wire.

2. The electroluminescent device of claim 1, wherein:
the peripheral area includes a first organic surface portion completely surrounding the emission area in a plan view, completely surrounded by the inorganic surface portion in a plan view, and located outside the upper electrode in a plan view;
the peripheral area includes a second organic surface portion extending along the peripheral area such that the emission area is not completely surrounded by the second organic surface portion in a plan view, completely surrounded by the inorganic surface portion in a plan view, and located outside the upper electrode in a plan view;
the first and second organic surface portions are spaced apart from each other in a plan view;
the first organic surface portion has an edge and the entire edge of the first organic surface portion directly contacts the inorganic surface portion in a plan view; and
the second organic surface portion has an edge and the entire edge of the second organic surface portion directly contacts the inorganic surface portion in a plan view.

3. The electroluminescent device of claim 2, wherein the second organic surface portion partially surrounds the emission area in a plan view.

4. The electroluminescent device of claim 3, wherein the second organic surface portion has only one opening to discontinuously surround the emission area in a plan view.

5. The electroluminescent device of claim 1, wherein:
the peripheral area includes an organic surface portion completely surrounding the emission area in a plan view, and located outside the upper electrode in a plan view;
the lower surface of the flexible encapsulation multilayer directly contacts the organic surface portion such that the organic surface portion is partially covered by the lower surface of the flexible encapsulation multilayer;
the organic surface portion includes an inner edge having at least a portion directly contacting the inorganic surface portion in a plan view; and
the organic surface portion includes an outer edge having a first portion which directly contacts the inorganic surface portion in a plan view and a second portion which does not directly contact the inorganic surface portion in a plan view.

6. The electroluminescent device of claim 5, wherein:
the inorganic surface portion includes a second inorganic surface branch extending along the peripheral area such that the emission area is not completely surrounded by the second inorganic surface branch in a plan view;
the second inorganic surface branch has an inner edge;
the entire inner edge of the second inorganic surface branch directly contacts the outer edge of the organic surface portion in a plan view; and
the second inorganic surface branch is spaced apart from the first inorganic surface branch in a plan view.

7. The electroluminescent device of claim 6, wherein the second inorganic surface branch partially surrounds the emission area in a plan view.

8. The electroluminescent device of claim 5, wherein:
the upper electrode power supply wire includes a bus wire and an auxiliary upper electrode which extends along a periphery of the emission area;
the auxiliary upper electrode has a lower surface facing a top surface of the bus wire to electrically communicate with the top surface of the bus wire and a top surface facing a lower surface of the upper electrode to electrically communicate with the lower surface of the upper electrode;

the lower structure further comprises a peripheral circuit located under the auxiliary upper electrode in the peripheral area; and a portion of the touch wire extends substantially along the periphery of the emission area and overlaps both the auxiliary upper electrode and the peripheral circuit.

9. The electroluminescent device of claim 8, wherein widths of the portions of the touch wires decrease in a direction substantially perpendicular to a direction in which the touch wires extend.

10. The electroluminescent device of claim 8, wherein the peripheral area further includes an auxiliary touch wire electrically connected to the touch wire and overlapping the portion of the touch wire.

11. The electroluminescent device of claim 8, wherein:
at least one of the lower electrode power supply terminals, at least one of the touch terminals, and at least one of the upper electrode power supply terminals are located in a terminal area of the peripheral area;
the peripheral area includes a bendable area extending between the emission area and the terminal area;
at least one selected from a group of the lower electrode power supply wire, the upper electrode power supply wire, and the touch wire includes a conductive bridge for transmitting an electrical signal through the bendable area; and
the conductive bridge is formed in a different layer from at least a portion of the rest of the at least one selected from the group of the lower electrode power supply wire, the upper electrode power supply wire, and the touch wire.

12. The electroluminescent device of claim 5, wherein:
the touch wire further comprises a third portion overlapping the upper electrode power supply wire; and
the first portion of the touch wire is located between the second and third portions of the touch wire.

13. The electroluminescent device of claim 12, wherein the third portion of the touch wire overlaps an end portion of the upper electrode power supply wire.

14. The electroluminescent device of claim 5, wherein at least one of the lower electrode power supply terminals, at least one of the touch terminals, and at least one of the upper electrode power supply terminals are located in a terminal area of the peripheral area and have substantially the same heights to be electrically connected to one external circuit board.

15. The electroluminescent device of claim 14, wherein the at least one of the touch terminals is located between the at least one of the lower electrode power supply terminals and the at least one of the upper electrode power supply terminals.

16. The electroluminescent device of claim 14, wherein:
the peripheral area includes a bendable area extending between the emission area and the terminal area; and
the touch wire does not overlap the lower electrode power supply wire and the upper electrode power supply wire in the bendable area.

17. The electroluminescent device of claim 14, wherein a size of the touch terminal is substantially less than a size of the lower electrode power supply terminal or a size of the upper electrode power supply terminal.

18. The electroluminescent device of claim 5, wherein:
at least one selected from a group of the lower electrode power supply terminal and the upper electrode power supply terminal is located in a power terminal area of the peripheral area and electrically connected to a first external circuit board;

the touch terminal is located in a touch terminal area of the peripheral area and electrically connected to a second external circuit board;

the power terminal area and the touch terminal area are located at a side of the lower structure and do not overlap each other in a plan view;

the first external circuit board and the second external circuit board are located at the side of the lower structure and do not overlap each other in a plan view;

a direction in which the first external circuit board is attached to the at least one selected from the group of the lower electrode power supply terminal and the upper electrode power supply terminal is substantially the same as a direction in which the second external circuit board is attached to the touch terminal;

the flexible encapsulation multilayer includes a first inorganic layer, an organic layer located on the first inorganic layer, and a second inorganic layer located on the organic layer; and the touch terminal area does not overlap the organic layer in a plan view.

19. The electroluminescent device of claim 5, wherein:
at least one selected from a group of the lower electrode power supply terminal and the upper electrode power supply terminal is located in a power terminal area of the peripheral area to be electrically connected to a first external circuit board;

the touch terminal is located in a touch terminal area of the peripheral area to be electrically connected to a second external circuit board;

the power terminal area and the touch terminal area are located at a side of the lower structure and do not overlap each other in a plan view;

the first external circuit board and the second external circuit board are located at the side of the lower structure and do not overlap each other in a plan view;

a direction in which the first external circuit board is attached to the at least one selected from the group of the lower electrode power supply terminal and the upper electrode power supply terminal is substantially opposite to a direction in which the second external circuit board is attached to the touch terminal;

the flexible encapsulation multilayer includes a first inorganic layer, an organic layer located on the first inorganic layer, and a second inorganic layer located on the organic layer; and the touch terminal area does not overlap the organic layer in a plan view.

20. The electroluminescent device of claim 5, wherein the entire inner edge of the organic surface portion directly contacts the inorganic surface portion in a plan view.

21. The electroluminescent device of claim 5, wherein the first inorganic surface branch is located substantially inner than the organic surface portion in a plan view.

22. An electroluminescent device, comprising:
a lower structure which has an emission area and a peripheral area surrounding the emission area, and which comprises an insulation film on an inorganic insulating film and an electroluminescent unit having a lower electrode disposed on the insulation film, an intermediate film disposed on the lower electrode, and an upper electrode disposed on the intermediate film;

a flexible encapsulation multilayer disposed on the emission area and the peripheral area of the lower structure, and including at least three layers; and a touch panel disposed on the flexible encapsulation multilayer, and having a touch electrode, wherein the peripheral area includes a lower electrode power supply terminal, a lower electrode power supply wire electrically connecting the lower electrode to the lower electrode power supply terminal, an upper electrode power supply terminal, an upper electrode power supply wire electrically connecting the upper electrode to the upper electrode power supply terminal, a touch terminal, and a touch wire electrically connecting the touch electrode to the touch terminal, wherein the flexible encapsulation multilayer includes a lower surface comprising only one or more inorganic materials, wherein the peripheral area includes an inorganic surface portion substantially surrounding the emission area, disposed outside the upper electrode in a plan view, and comprising only one or more inorganic materials, wherein an entire of the inorganic surface portion directly contacts the lower surface of the flexible encapsulation multilayer, wherein the lower structure includes a lower encapsulating inorganic film horizontally expanding below a surface of the lower structure to vertically correspond to the emission area and the peripheral area, and a portion of the lower structure disposed between the lower encapsulating inorganic film and the entire of the inorganic surface portion comprises only one or more inorganic materials, wherein the lower encapsulating inorganic film has a hole filled with an inorganic material substantially different from that of the lower encapsulating inorganic film, wherein the touch wire comprises a first portion overlapping the lower electrode power supply wire and a second portion overlapping the upper electrode power supply wire, wherein the lower electrode is disposed on a top surface of the insulation film, and the entire of the inorganic surface portion is disposed to be relatively lower than the top surface of the insulation film, wherein the inorganic surface portion has at least a region including a plurality of inorganic surface branches which are spaced apart from each other, wherein the peripheral area further includes an organic surface portion which is disposed between the inorganic surface branches, which comprises an organic material, which substantially surrounds the emission area, and which is substantially surrounded in a plan view by a direct contact interface between the inorganic surface portion and the lower surface of the flexible encapsulation multilayer, wherein the inorganic surface branches include an outer inorganic surface branch disposed relatively outer than the organic surface portion and an inner inorganic surface branch disposed relatively inner than the organic surface portion, and wherein the upper electrode power supply wire comprises a bus wire extending on a top surface of the inorganic insulating film along a periphery of the emission area and an auxiliary upper electrode which extends on a side surface of the insulation film and the top surface of the insulation film along the periphery of the emission area to electrically contact both a top surface of the bus wire and a lower surface of the upper electrode.

23. The electroluminescent device of claim 22, wherein the electroluminescent device is capable of being flexed, bent, folded, rolled, or stretched by an end user.

24. The electroluminescent device of claim 22, wherein the inorganic surface portion includes at least two stepped surface portions each including a top surface portion of the inorganic insulating film, a side surface portion of the bus wire, and a top surface portion of the bus wire, and wherein the bus wire has an outer edge portion and an inner edge portion opposite to the outer edge portion, the outer edge portion of the bus wire is relatively farther than the inner edge portion of the bus wire from the emission area, the outer edge portion of the bus wire is disposed under the lower surface of the flexible encapsulation multilayer, and the outer edge portion of the bus wire is not in direct contact with the lower surface of the flexible encapsulation multilayer.

25. The electroluminescent device of claim 24, wherein the inorganic surface portion further includes at least two stepped surface portions each including a top surface portion of the inorganic insulating film, a side surface portion of the auxiliary upper electrode, and a top surface portion of the auxiliary upper electrode, and wherein the auxiliary upper electrode has an outer edge portion and an inner edge portion opposite to the outer edge portion, the outer edge portion of the auxiliary upper electrode is relatively farther than the inner edge portion of the auxiliary upper electrode from the emission area, the outer edge portion of the auxiliary upper electrode is disposed under the lower surface of the flexible encapsulation multilayer, and the outer edge portion of the auxiliary upper electrode is not in direct contact with the lower surface of the flexible encapsulation multilayer.

26. The electroluminescent device of claim 24, wherein the inorganic surface portion further includes at least two stepped surface portions each including a top surface portion of the bus wire, a side surface portion of the auxiliary upper electrode, and a top surface portion of the auxiliary upper electrode, and wherein the auxiliary upper electrode has an outer edge portion and an inner edge portion opposite to the outer edge portion, the outer edge portion of the auxiliary upper electrode is relatively farther than the inner edge portion of the auxiliary upper electrode from the emission area, the outer edge portion of the auxiliary upper electrode is disposed under the lower surface of the flexible encapsulation multilayer, and the outer edge portion of the auxiliary upper electrode is not in direct contact with the lower surface of the flexible encapsulation multilayer.

27. The electroluminescent device of claim 24, wherein the inorganic surface portion further includes at least two stepped surface portions each including a top surface portion of the inorganic insulating film, a side surface portion of the auxiliary upper electrode, and a top surface portion of the auxiliary upper electrode, wherein the inorganic surface portion further includes at least two stepped surface portions each including a top surface portion of the bus wire, a side surface portion of the auxiliary upper electrode, and a top surface portion of the auxiliary upper electrode, and wherein the auxiliary upper electrode has an outer edge portion and an inner edge portion opposite to the outer edge portion, the outer edge portion of the auxiliary upper electrode is relatively farther than the inner edge portion of the auxiliary upper electrode from the emission area, the outer edge portion of the auxiliary upper electrode is disposed under the lower surface of the flexible encapsulation multilayer, and the outer edge portion of the auxiliary upper electrode is not in direct contact with the lower surface of the flexible encapsulation multilayer.

28. The electroluminescent device of claim 22, wherein the inorganic surface portion further includes at least two stepped surface portions each including a top surface portion of the bus wire, a side surface portion of the auxiliary upper electrode, and a top surface portion of the auxiliary upper electrode, and wherein the auxiliary upper electrode has an outer edge portion and an inner edge portion opposite to the outer edge portion, the outer edge portion of the auxiliary upper electrode is relatively farther than the inner edge portion of the auxiliary upper electrode from the emission area, the outer edge portion of the auxiliary upper electrode is disposed under the lower surface of the flexible encapsulation multilayer, and the outer edge portion of the auxiliary upper electrode is not in direct contact with the lower surface of the flexible encapsulation multilayer.

29. The electroluminescent device of claim 22, wherein the inner inorganic surface branch includes at least a portion of a top surface of the auxiliary upper electrode to have a height relatively greater than a height of the outer inorganic surface branch, and wherein a portion of a surface of the bus wire directly contacts the lower surface of the flexible encapsulation multilayer and the portion of the surface of the bus wire is relatively farther than the organic surface portion from the emission area.

30. The electroluminescent device of claim 29, wherein the portion of the surface of the bus wire, which directly contacts the lower surface of the flexible encapsulation multilayer, is included in the outer inorganic surface branch.

* * * * *